(12) United States Patent
Mehta et al.

(10) Patent No.: US 10,409,926 B2
(45) Date of Patent: Sep. 10, 2019

(54) LEARNING EXPECTED OPERATIONAL BEHAVIOR OF MACHINES FROM GENERIC DEFINITIONS AND PAST BEHAVIOR

(71) Applicant: Falkonry Inc., Santa Clara, CA (US)

(72) Inventors: Nikunj R. Mehta, Cupertino, CA (US); Prasanta Bose, Sunnyvale, CA (US)

(73) Assignee: Falkonry Inc., Sunnyvale, CA (US)

( * ) Notice: Subject to any disclaimer, the term of this patent is extended or adjusted under 35 U.S.C. 154(b) by 723 days.

(21) Appl. No.: 14/092,737

(22) Filed: Nov. 27, 2013

(65) Prior Publication Data

US 2015/0149134 A1    May 28, 2015

(51) Int. Cl.
*G06G 7/48* (2006.01)
*G06F 17/50* (2006.01)
*G05B 23/02* (2006.01)

(52) U.S. Cl.
CPC ..... *G06F 17/5009* (2013.01); *G05B 23/0227* (2013.01); *G05B 23/0245* (2013.01)

(58) Field of Classification Search
CPC .................................................. G06F 17/5009
USPC .............................................................. 703/6
See application file for complete search history.

(56) References Cited

U.S. PATENT DOCUMENTS

| | | | |
|---|---|---|---|
| 5,764,509 A | 6/1998 | Gross | |
| 6,199,018 B1 * | 3/2001 | Quist | G01M 13/028 318/806 |
| 6,519,575 B1 | 2/2003 | Goebel | |
| 6,757,668 B1 | 6/2004 | Goebel | |
| 7,233,886 B2 | 6/2007 | Wegerich | |
| 7,308,385 B2 | 12/2007 | Wegerich | |
| 8,036,999 B2 | 10/2011 | Akhrarov | |
| 2002/0103626 A1 | 8/2002 | Zhao et al. | |
| 2004/0172177 A1 | 9/2004 | Nagai | |
| 2007/0028219 A1 * | 2/2007 | Miller | G05B 23/021 717/124 |

(Continued)

OTHER PUBLICATIONS

P. Ribot, Generic characterization of diagnosis and prognosis for complex heterogeneous systems, Int'l J of Prognostics & Health Management, United States, 2013, 18 pages.

(Continued)

*Primary Examiner* — Hugh M Jones
(74) *Attorney, Agent, or Firm* — Hickman Palermo Becker Bingham LLP

(57) ABSTRACT

In an embodiment, a data processing method comprises storing one or more generic machine operating definitions, wherein each of the generic machine operating definitions describes expected operational behavior of one or more types of machines during one or more operating states; analyzing operating data that describes past operation of a plurality of machines of a plurality of types; based at least in part on the operating data and the one or more generic machine operating definitions, generating and storing one or more machine operating models that describe expected operational behavior corresponding to a plurality of operating states of the plurality of machines; wherein the one or more machine operating models comprise a plurality of data patterns, wherein each of the data patterns is associated with a different set of one or more operating states of one or more machines; wherein the method is performed by one or more computing devices.

19 Claims, 13 Drawing Sheets

(56) References Cited

U.S. PATENT DOCUMENTS

| | | | |
|---|---|---|---|
| 2007/0028220 A1* | 2/2007 | Miller | G05B 23/0278 717/124 |
| 2008/0027678 A1 | 1/2008 | Miller | |
| 2008/0103996 A1 | 5/2008 | Forman | |
| 2008/0271057 A1 | 10/2008 | Bates | |
| 2009/0037772 A1 | 2/2009 | Wegerich et al. | |
| 2009/0092299 A1 | 4/2009 | Jerebko | |
| 2010/0114806 A1 | 5/2010 | Harrison et al. | |
| 2012/0075103 A1 | 3/2012 | Powell | |
| 2013/0019125 A1 | 1/2013 | Almubarak | |
| 2013/0238619 A1 | 9/2013 | Hanaoka | |
| 2013/0294560 A1 | 11/2013 | Graham | |
| 2014/0052349 A1 | 2/2014 | Tsukane | |
| 2015/0026622 A1 | 1/2015 | Rosldson | |
| 2015/0169190 A1 | 6/2015 | Girardeau | |
| 2018/0329593 A1 | 11/2018 | Mehta | |

OTHER PUBLICATIONS

J. Sen Gupta et al., Characterization of prognosis methods: an industrial approach, European Conf of the Prognostics and Health Management Society, 2012, published in United States, 9 pages.

J. Courrech et al., Condition Monitoring of Machinery, chapter 16 of Harris' Shock and Vibration Handbook, McGraw-Hill, New York, 2002.

A. Saxena, "Prognostics: The Science of Prediction," Annual Conf of PHM Society PHM 2010, Oct. 10, 2010, published by Prognostics Center of Excellence, United States, 70 pages.

Mehta, U.S. Appl. No. 14/172,816, filed Feb. 24, 2014, Interview Summary, dated Feb. 16, 2017.

U.S. Appl. No. 14/172,816, filed Feb. 4, 2014, Office Action, dated Sep. 27, 2016.

Mehta, U.S. Appl. No. 14/172,816, filed Feb. 4, 2014, Final Office Action, dated May 4, 2017.

Mehta, U.S. Appl. No. 14/172,816, filed Feb. 4, 2014, Interview Summary, dated Jul. 5, 2017.

* cited by examiner

Example System or Unit

US 10,409,926 B2

LEARNING EXPECTED OPERATIONAL BEHAVIOR OF MACHINES FROM GENERIC DEFINITIONS AND PAST BEHAVIOR

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright or rights whatsoever. ©2019 Falkonry Inc.

TECHNICAL FIELD

The present disclosure relates to monitoring machines and predicting operational behavior of the machines.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Power plants, waste water treatment plants, factories, airplanes, and automobiles are some examples of complex systems that include multiple machines operating to accomplish objectives. These complex systems include physical components that degrade over time, components that fail, and components that are being used incorrectly or suboptimally. Degradation, failure, or incorrect or sub-optimal use of a given component in the system may affect other components of the system that depend on the given component.

As a component operates in the system, the component may be configured to operate differently during different operating states. For example, a machine may power up, warm up, run, cool down, and shut down. The machine may be configured to produce little or no output during the power up state; whereas, the machine may be configured to produce maximum output during the run state. Regardless of how a component is configured, the component can behave unexpectedly in any operating state. In a complex system, multiple components may behave unexpectedly for a long period of time even though the system as a whole may operate relatively efficiently over that period of time.

Operation of various components in the system may be monitored using sensors, which measure and report data about the operational behavior of the components. The sensors themselves are also susceptible to degradation, failure, and sub-optimal use, and this susceptibility creates uncertainty around the measurements themselves and around the behavior of the components in the system. The sensors may feed into customized triggers that provide alerts when measurements go outside certain boundaries. The customized triggers may be set up by engineers, such as maintenance engineers, that are assigned to oversee operation and maintenance of the machines and to promote overall health and efficiency of the system.

Accordingly, the overall health and efficiency of the system may be highly dependent on the knowledge, skill, expertise, and accuracy of the maintenance engineer, who is a human being. The overall health and efficiency of the system may also depend on a variable degree of uncertainty surrounding the sensors and the behavior of the components in the systems. In light of the complexity of the system, there are often few human beings who are able to make the accurate judgments required by the maintenance engineer, and even fewer who are available to verify the correctness of the judgments made by the maintenance engineer. Although the output of a given system may be observed at a high level, there is usually little or no knowledge of how much better the maintenance engineer could be performing.

Further, some machines come with manuals or specifications that explain, to the maintenance engineer, how frequently to perform certain maintenance operations on the machines. Due to the wide variety of systems and changing operating environments in which the machines may be used, such manuals or specifications often grossly over-estimate or under-estimate the frequency in which such maintenance should be performed in a given environment. Such problems are often difficult to detect and often lead to inefficiencies that exponentially increase as the size and complexity of the system increases.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

In an embodiment, a data processing method comprises storing one or more generic machine operating definitions, wherein each of the generic machine operating definitions describes expected operational behavior of one or more types of machines during one or more operating states;

analyzing operating data that describes past operation of a plurality of machines of a plurality of types; based at least in part on the operating data and one or more generic machine operating definitions, generating and storing one or more machine operating models that describe expected operational behavior corresponding to a plurality of operating states of the plurality of machines; wherein the one or more machine operating models comprise a plurality of data patterns, wherein each of the data patterns is associated with a different set of one or more operating states of one or more machines; wherein the method is performed by one or more computing devices.

In various embodiments, computer systems, stored instructions, and technical steps are described for learning expected operational behavior of machines. The machines may include, for example, physical systems of a variety of functioning units, physical units of particular functions operating together, physical components supporting a particular function of a physical unit, sensors measuring inputs, outputs, or byproducts of any element of the system, and/or any other physical assets or physical elements that contribute to an industrial or complex physical operation. In one embodiment, storage devices or storage services store generic machine operating definitions. Each of the generic machine operating definitions describes expected operational behavior of types of machines during operating states of those types of machines. Computing devices or computing services operate modeling logic, such as computers configured to execute stored modeling instructions, that analyzes operating data that describes past operation of machines of a variety of types and, based at least in part on the operating data and the generic machine operating definitions, generate and store machine operating models. "Models," in this context, may mean relations, equations, graphs, tables, state machines, or other data stored in computer storage and that describe expected operational behavior of the machines corresponding to states of the machines.

Figure 5:
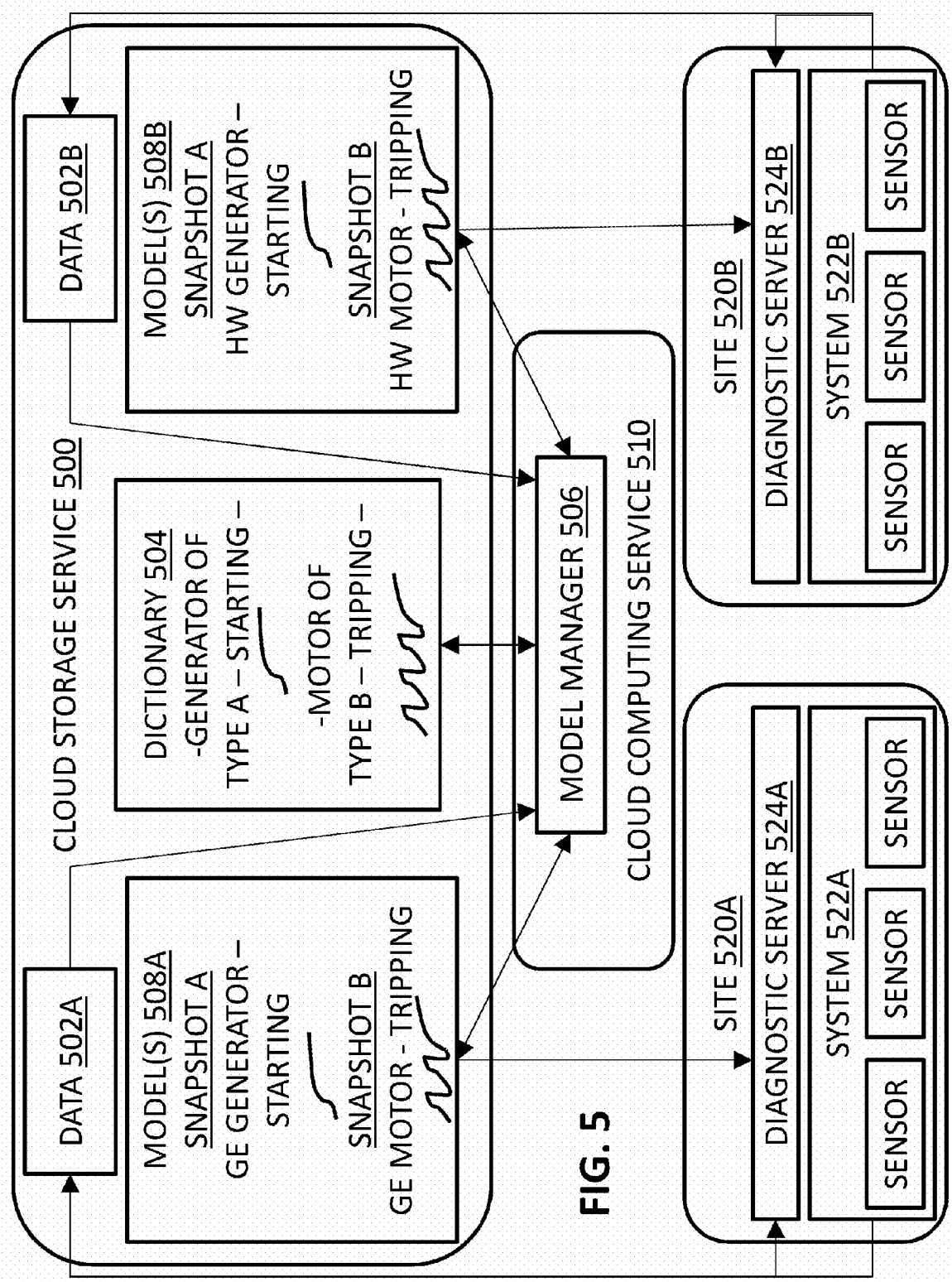
FIG. 5 illustrates an example model manager operating on cloud-based services to generate models that describe expected operational behavior of machines.

The machine operating models may include patterns, and each pattern may be associated with a different set of operating states of machines. The patterns may be time series or time-based data, or characteristics thereof, that capture, represent, or are otherwise based on average or persistent measurement trends for one or more machine parameters over time, such as temperature, pressure, speed, vibration, current, sound, power or resource consumption, movement, torque, or power, resource (refined oil, water, etc.), or byproduct (pollution, carbon dioxide, etc.) output. In an illustrated example, the patterns may include a measurement of output over time, as shown for various machines in model(s) 508A and 508(*b*) of FIG. 5. Although FIG. 5 shows one measurement parameter over time, the patterns may actually be based on multiple measurement parameters that may have different shapes over time. Some parameters, such as temperature, may trail other parameters, such as engine speed. The operating states may include normal, abnormal, or even failing states of machines and/or their components (for example, Gearbox_Status, MotorCoil_Status, Shaft_lubrication_Oil_Status, Bearing_Status, heatExchanger_Status), and the operating states may alternatively or additionally include information about a stage of operation such as starting, running, or shutting down and stressing or otherwise associated with particular operating environments, such as cold-season, hot-season, etc.

Diagnostic logic, such as computers configured to execute stored diagnostic instructions, may receive new operating data from machines in the system, and apply the machine operating models, which were based on operating data, to estimate current machine operating states or predict future operating behavior. The diagnostic logic may continuously or periodically receive such new data such as streaming measurements from sensors, and continuously update estimations or predications based on the streaming data.

In addition to using the new operating data for diagnostic purposes, the new operating data may also be continuously or periodically stored on the storage devices or storage services and added to the set of past operating data. The past operating data may include machine operating measurements that have already been obtained from sensors on machines. The modeling logic may then use updated past operating data, after the new operating data has been added, to continuously or periodically adapt or modify the machine operating models. For example, the modeling logic may re-compute the machine operating models based on the set of past operating data as a whole after it is updated. Alternatively, the modeling logic may add patterns to the machine operating models based on the new operating data without re-computing the machine operating models as a whole.

A machine health management system may include modeling logic such as stored modeling instructions or modeling computers that execute instructions to build and manage the machine models and diagnostic logic such as stored diagnostic instructions or diagnostic computers that execute instructions to use the machine models provided by the modeling logic to perform anomaly detection and diagnosis. The machine management system may be centralized on one computing device, a cluster of computing devices, or a single cloud, or distributed over multiple computing devices, multiple clusters, or multiple clouds. By continuously or periodically updating the estimations or predictions and continuously or periodically updating the machine operating models, the machine management system provides a dynamic machine management solution that reacts to changing conditions in the system of machines and in the environment surrounding the system. Static machine management solutions, unlike the dynamic solution, cannot account for dynamic changing conditions that are specific to a system or to the environment surrounding the system.

In various examples, the machine health management system may detect deviation from expected behavior of a system, unit, component, sensor, or other machine element, and estimate future state of that element by attributing the deviation to degradation, misuse of the element, a trip of the element, or some other historical state that is known to have produced similar measurements in the past. The state of multiple elements may be estimated and learned from to identify dynamics of hidden degradations and/or faults and how these hidden degradations and/or faults affect different elements.

In this description, things identified using the plural include embodiments that use one or more things or a single thing. For example, each reference to devices, services, models, and clusters includes the singular as well as one or more items.

Figure 1:
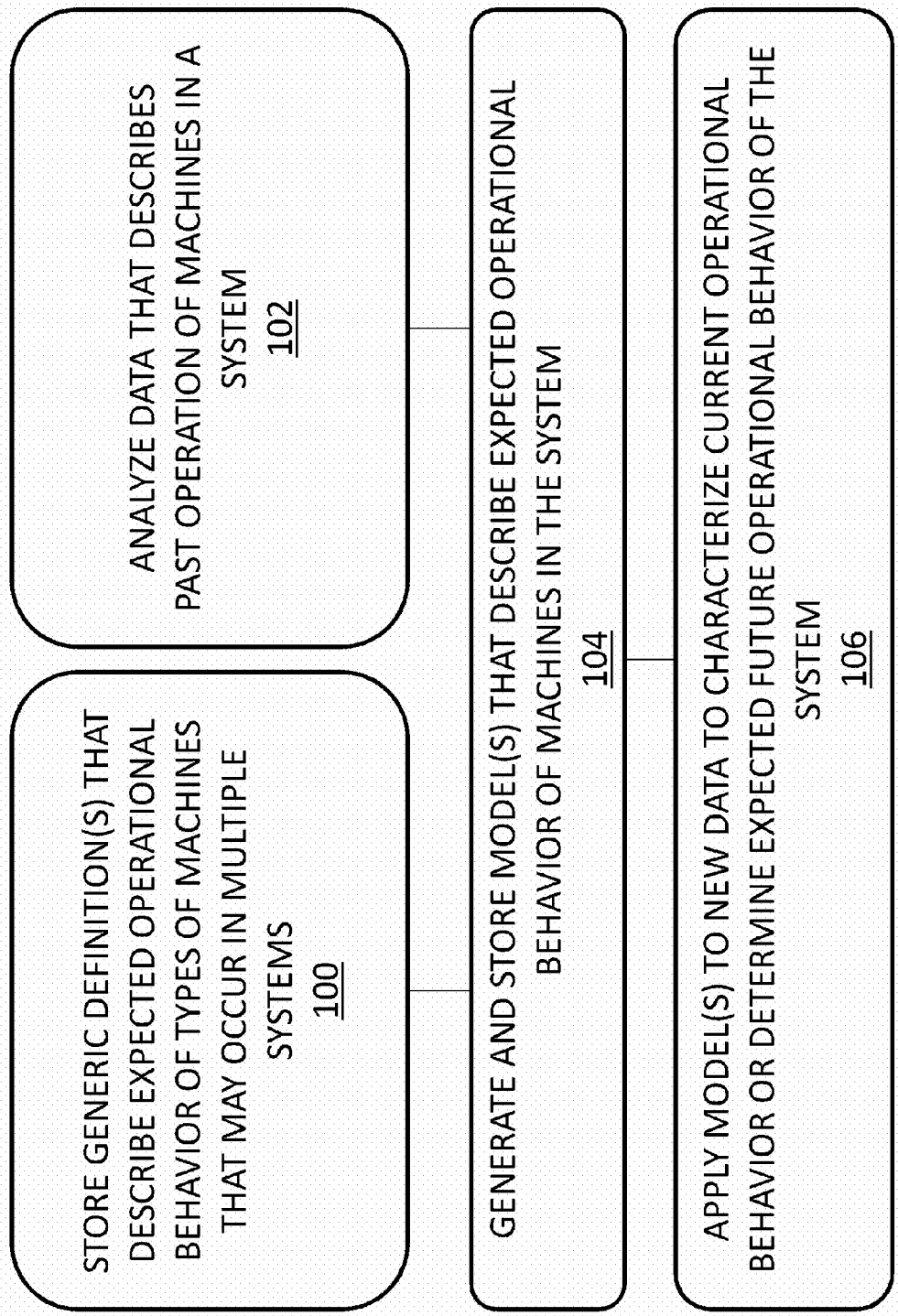
FIG. 1 illustrates an example process for generating and using models that describe expected operational behavior of machines in a system.

FIG. 1 illustrates an example process for generating models that describe expected operational behavior of machines in a system.

In an embodiment, the process includes, in step 100, storing generic definitions that describe expected operational behavior of types of machines that may occur in multiple systems.

The process also includes, in step 102, analyzing data that describes past operation of machines in a system.

Then, in step 104, one or more computing devices, such as computers operating modeling logic, generate and store models that describe expected operational behavior of machines in the system.

In step 106, one or more computing devices, such as computers operating diagnostic logic, may apply the models to new data to characterize current operational behavior or determine expected future operational behavior of the system.

Each of the steps of FIG. 1 may be implemented in various embodiments using computer logic circuits, a computer configured with stored instructions that are loaded and executed, and/or computer-readable storage media storing instructions which when executed cause performing the process of FIG. 1. Using this process, a modeling and diagnostic system may learn and make predictions or estimations based on past operating behavior while a managed system is operating; automatically update models as new operating behavior is observed in the managed system, and automatically adjust the predictions or estimations to account for the new operating behavior of the managed system.

Other sections herein provide a detailed description of an example implementation of each of the operations of FIG. 1. For example, storing generic definitions is described further in other sections herein such as GENERIC MACHINE OPERATING DEFINITIONS.

Figure 8:
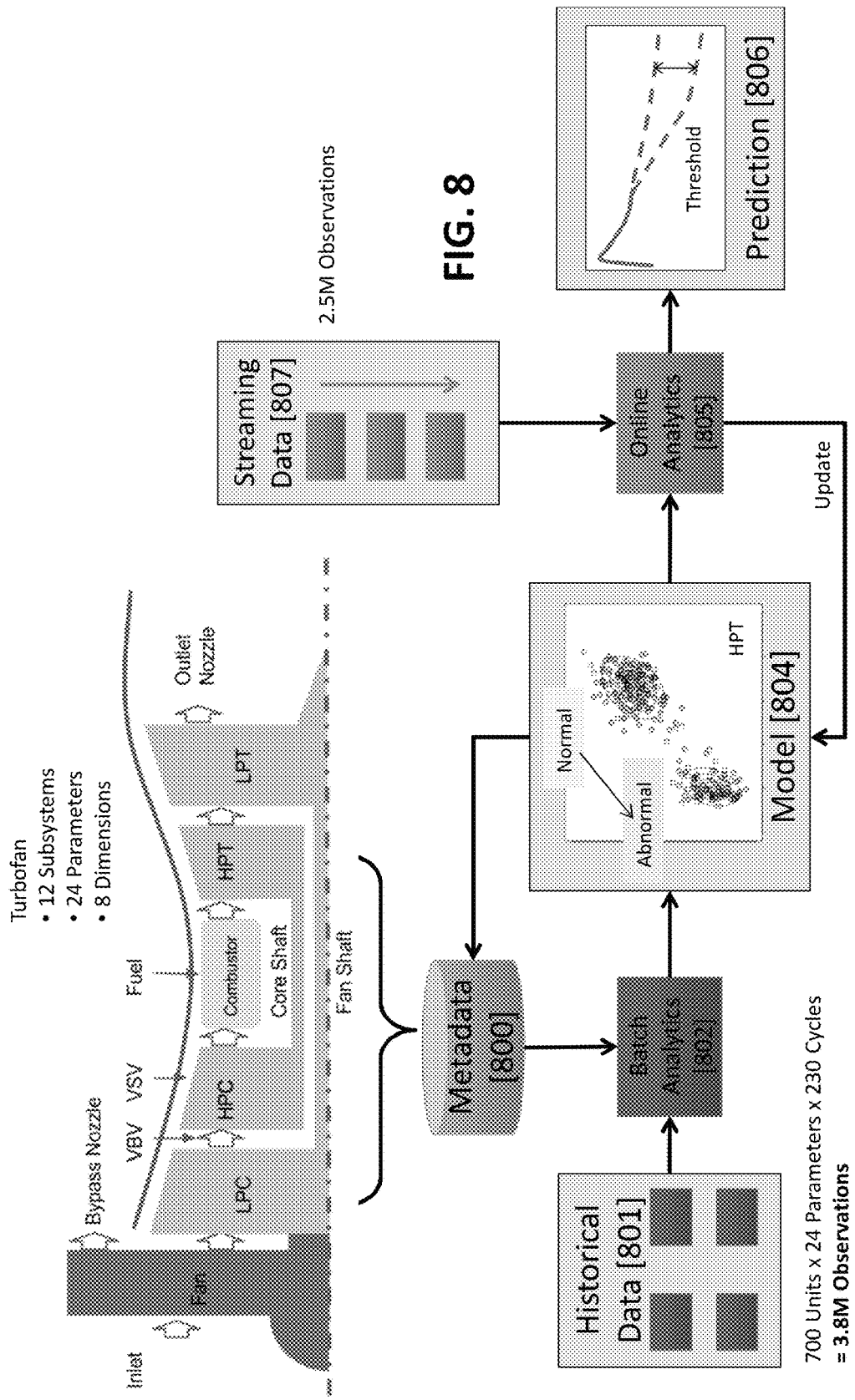
FIG. 8 illustrates an example machine health management system for generating, applying, and updating models.

FIG. 8 shows an example machine health management system for generating models such as model 804 based on batch analytics 802, historical data 801, and metadata 800. For example, the metadata 800 may describe machines in a system and relationships between those machines. In the example, the metadata describes 12 subsystems, 24 parameters that are measured in those subsystems, and 8 dimensions to the measured parameters. The metadata 800 may include one or more generic definitions, one or more sub-definitions, and one or more relationships between definitions. The metadata 800 provides an organization, schema, or context in which the historical data 801 may be analyzed. In one example, a model 804 is built for a fan component based on metadata 800 that describes which sensors relate to the fan component and optionally how these sensors relate to the fan component. In the example, the model 804 is also based on historical data 801 from these related sensors.

As shown, model 804 clusters observations into two clusters, one representing normal behavior and one representing abnormal behavior. Online analytics 805 is performed by comparing streaming time-series data 807 to model 804. By matching and fusing current measurements from streaming data 807 to clusters in model 804, and estimating certain states for current operational behavior, online analytics 805 may result in prediction 806 that of states that are historically and/or causally likely to result from the estimated states. As shown, streaming data 807 may account for the solid line in prediction 806, and two estimated future states are represented by the dashed lines. The two estimated future states may carry a probability based on how frequently these estimated states resulted, in the past, from states similar to the state represented by the solid line.

Online analytics 805 may also result in updating model 804 to better fit streaming data 807 in addition to historical data 801.

Figure 9:
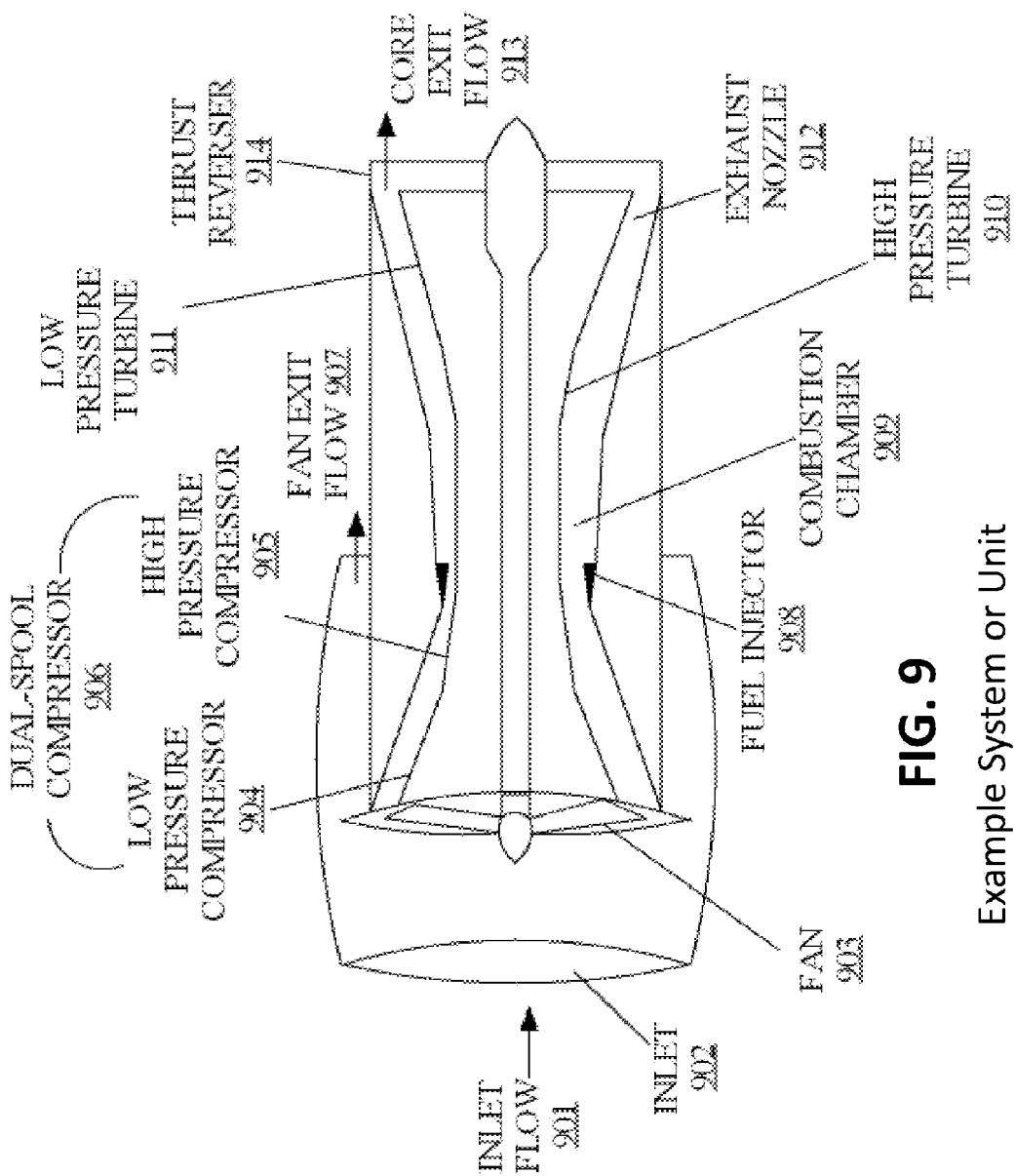
FIG. 9 illustrates an example system on which the example machine health management system may be used.

FIG. 9 shows an example system or unit with several components and several sensors that may measure operation of those components. The example system of FIG. 9 is just one example system that may be monitored and diagnosed by the machine health management system of FIG. 8. As shown, the system is a jet engine propulsion system that has an inlet flow 901 via an inlet 902. Compressors 904, 905, 906 receiving inlet flow 901 via inlet 902 and fan 903 compress airflow to the combustion chamber 909 where combustion is facilitated by a fuel injection component 908. Fan exit flow 907 is directed outside. Turbines 910, 911 operate to the pressure from the combustion chamber 909, and byproduct escapes via the core exit flow 913 in an exhaust nozzle 912. FIG. 9 also shows a thrust reverser 914.

Generic Machine Operating Definitions

The generic operating definitions describe expected operating behavior for types of machines (that is, types of systems, units, components, or sensors) rather than individual machines (that is, physical systems, units, components, or sensors that are in operation at a certain location in a certain manner and during a certain time). A single type may cover multiple individual machines, and each of these individual machines may differ in some characteristics that do not define the type. The operating data, on the other hand, describes operating behavior at the granularity of the individual machines (that is, individual systems, units, components, or sensors) that are in operation at a certain location in a certain manner and during a certain time. The generic operating definitions may be constructed based on specific machines but may also be used to classify other machines; whereas data collected from a specific machine is unique to that machine.

The generic operating definitions may also incorporate sub-definitions which, in turn, are also generic definitions. These sub-definitions may describe operating behavior for sub-elements of a set of elements that is described by a primary generic operating definition. The primary generic operating definition may relate different sub-definitions to each other using known relationships. For example, the primary generic definition may relate a generic sub-definition of a motor to a generic sub-definition of a gear by specifying that the gear is run by the motor. Based on other gears that were run by other motors, this relationship may create a unidirectional dependency or bidirectional dependency between the motor and the gear, with each element having different likelihoods of affecting the other element.

Generic operating definitions may be stored for different levels of knowledge about the specific machines used in a system. A high-level generic definition may include details that apply to systems that are organized to accomplish a particular purpose without regard to which machines may be implemented in those systems. The high-level generic definition may be instantiated by one or more lower-level generic definitions of systems of different types that are implemented. The different types of systems may be further instantiated by definitions that are specific to a given system that is currently deployed at a site.

Virtual definitions may be built on top of measurements, site-specific definitions, the lower-level generic definitions, and/or the high-level generic definitions. The virtual definitions may describe observations, alarms, or virtual sensors that are based on modified output from the definitions or measurements, and output from these virtual definitions may feed into other definitions. The virtual definitions may be used to detect certain patterns or aggregate characteristics of data that are not apparent from individual other definitions or measurements.

Relationships between definitions and measurements may be selected from a set of pre-defined relationships or may be defined as new types of relationships. The relationships may carry unidirectional or bidirectional dependencies and associated probabilities of those dependencies, and these dependencies may be preserved and re-used when the same relationships are applied between different generic definitions. For example, a relationship between a specific type of gear and a specific type of motor may be applied between any type of object that is moved mechanically by any type of motor. Another example relationship may be a relationship between a specific type of pressure cooker and a latch that seals the pressure cooker. In the latter example, the same relationship may be applied between another pressurized container and a physical mechanism for closing the container. In this manner, stored relationships may generically apply to many types of devices or may specifically apply to certain devices.

The relationships may be stored at various levels of specificity, and two entities referenced in a generic definition may be related to each other by high-level relationships that apply to many different types of entities and/or low-level relationships that apply only to specific devices. The machine health management system may learn the accuracy and consistency of multiple relationships that are specified between components, and the machine health management system may modify relationships of various levels of specificity. For example, the machine health management system may determine, based on additional measurements, a more accurate characterization of the interaction between gears and motors, and this more accurate characterization may be automatically applied to other gears and motors that are already related, in a generic definition, using this relationship.

Relations may be specified in generic definitions as attributes of the related entities. For example, a generic definition for a gear may include an attribute that identifies a relationship with a motor, and the generic definition for the motor may, in turn, include an attribute that identifies a relationship with the gear.

In one example, generic definitions of multiple units may be stored as:

```
module.exports = [
    "$system" : "_system_1_"
    "title" : "Engine01"
,
    "$system" : "_system_1_"
    "title" : "Engine02"
,
    "$system" : "_system_1_"
    "title" : "Engine01"
,
    "$system" : "_system_1_"
    "title" : "Engine02"..}
```

Continuing with the example, generic definitions for sub-systems in a system may be stored as:

```
module.exports = [
    "$system" : "_system_1_"
    "title" : "Ambient"
,
    "$system" : "_system_1_"
    "title" : "Inlet"
,
    "$system" : "_system_1_"
    "title" : "Fan"
,
    "$system" : "_system_1_"
    "title" : "Splitter"
,
```

-continued

```
    "$system" : "_system_1_"
    "title" : "Bypass Path"
,
    "$system" : "_system_1_"
    "title" : "Bypass Nozzle"
,
    "$system" : "_system_1_"
    "title" : "Low Pressure Compressor"
...}
```

Continuing with the example, generic definitions for parameters of a unit may be stored as:

```
module.exports = [
    "$unit" : "_unit_1_"
    "$dimension" : "_dimension_1_"
    "$parameter" : "_parameter_1_"
    "title" : "1"
    "timed" : "true"
    "kind" : "SensorDeployment"
,
    "$unit" : "_unit_1_"
    "$dimension" : "_dimension_2_"
    "$parameter" : "_parameter_2_"
    "title" : "2"
    "timed" : "true"
    "kind" : "SensorDeployment"
..
}
```

FIG. 7A, FIG. 7B, FIG. 7C, FIG. 7D show an example generic definition of a system. The generic definition incorporates generic sub-definitions for multiple entities in the system at varying degrees of specificity, and relationships between these generic sub-definitions. Each generic sub-definition is itself a generic definition that may be based on knowledge about a certain type or group of machines, and/or may incorporate other generic sub-definitions.

The generic definition also incorporates generic relationships between the different sub-definitions. These generic relationships represent causal relationships. For example, a generic relationship may extend a causal chain in both directions, unidirectionally, or stop the causal chain. In one example, a generic relationship has multiple effects with different probabilities. For example, a gear may have a low likelihood of affecting a motor that is operably attached to the gear, and the motor may have a higher likelihood of affecting the gear.

As shown in FIG. 7A, FIG. 7B, FIG. 7C, FIG. 7D, an example design generic definition includes a high-level definition of entities that may be in a system, and the relationships between those entities. In the example, the definition specifies a physical quantity, such as temperature or velocity, that is assigned a human-specified label and is designed to observe a parameter, such as T2, T24, or T30. The parameter is also assigned a human-specified label and is designed to be measured on a system, such as an engine. The parameter may be assessed on a parameter interaction that impacts a subsystem, such as a fan, a high-pressure turbine, a high-pressure chamber, or a low-pressure chamber. The sub-system may also be designed for the system.

As shown, the example design generic definition has relationships with a particular deployment that uses the design. In the deployment definition, a component deployment instantiates the design of the subsystem, and a unit instantiates the design of the system. As deployed, the component deployment is part of the unit and may interact with the unit in a generic manner that is specified in the design generic definition and/or in a more specific manner that is specified in the deployment definition. The unit is placed at a site, and the unit has sensors deployed inside. The sensor deployment is measured in frame of a dimension that is used to measure the physical quantity specified in the example design generic definition.

The sensor specified in the deployment definition may be deployed as an embedded sensor that is assembled in a component. The relationship between the sensor and the component may be specified in a manufacturing definition, and the component may be the particular instance of deploying the component deployment of the deployment definition.

A cyber definition may be built on top of other more physical definitions such as the deployment definition. In the example, the cyber definition groups the sensor into a sensor group by classifying the sensor as a sensor group element. The sensor group may include sensors for a particular operational region. The cyber definition may also build a virtual sensor on top of a physical sensor, and learning may be based on measurements or measurement observations from the physical sensor and/or measurements or measurement observations from the virtual sensor.

The cyber definition may also have an alarm that is raised on the component deployment to trigger, based on measurements taken from the system, an investigation into the health of the component. The cyber definition may also detect incidents that occur in the unit and are defined in terms of measurements that are taken from the system.

The cyber definition may also classify the unit as an item of fleet equipment that is included in a fleet, and learning about the system may be based on information about the unit itself and/or other units of the same fleet.

A modeling definition may include state models for the deployed sensor, the deployed component, and the unit. The state models may describe patterns of measurements that were observed when the modeled element was in a corresponding state. As shown, the state models each model a single state for a single element. However, a single model of an element may include multiple patterns, each of which may correspond to a different state of that element.

Generic operating definitions may be provided a priori at different levels of fidelity from just types of components and their parameters to a more detailed model of their behavior. The definitions are instantiated and used to complement or steer the process of learning from the operating data. For example, the generic operating definitions may be used to determine how to group sensors to focus the model building process, how many data patterns to look for, how to label the different data patterns, and how the labeled data patterns may affect other labeled data patterns.

In one example, a user interface is configured to prompt and receive, from experts, generic definitions that describe how certain types of machines should operate during various operating states. In another example, a set of default or configurable definitions are stored, based on the modeling logic vendor's expertise with certain types of machines, to describe how the certain types of machines should operate during various operating states. In particular examples, the generic definitions may account for materials developed by maintenance engineers about how the machines should operate under certain conditions, or machine vendor specifications that are distributed with the machines themselves.

In yet another example, characteristics are stored about various machines that may be operating in various systems, and the modeling logic may learn that certain groups of machines having same or similar characteristics as each other are likely to operate in a same or similar manner under certain operating states. The modeling logic may automatically label the learned groups as certain types based on the shared or similar characteristics, and expected operational behavior common to a group may be applied to other machines that, based on the shared or similar characteristics, are expected to be in the same group.

The generic operating definitions may include different definitions, each of which describes expected operational behavior of same or different types of machines during same or different sets of operating states. Machines of the same type may share certain characteristics and be allowed to differ in other characteristics. In one example, machines of the same vendor are of the same type, and machines from different vendors have different types. A generic definition for GM engines, for example, may describe how the GM engines generally operate even though a particular GM engine may operate differently in the field. In another example, machines of the same model are of the same type, and machines having different models have different types. A generic definition for a gas-powered engine, for example, may describe how gas-powered engines generally operate even though a particular gasoline engine may operate differently in the field.

Other characteristics may also be used to classify machines into different types. Other characteristics may include, but are not limited to, information that may be found in a specification for the machine, such as power consumption rates, power sources, material consumption rates, material sources, gear ratios, gear types, engine types, materials (that is, steel, wood, copper) of machine composition, model year, peak output volume or output rate, nominal output volume or output rate, output type, etc. For example, machines that generate power may be classified as one or more first types, and machines that consume power may be classified as one or more second types. Machines may be further classified based on how much power they generate or consume during nominal operation and/or peak operation. For example, a particular type of machine may include similar machines that are expected to have a similar output during similar operating states. In the example, a particular generic machine operating definition may describe an expected output of one or more particular types of machines, such as gas-powered generators or solar panels, during a particular operating state, such as starting up or running. In another example, a generic definition for GM engines, for example, may describe how the GM engines generally operate even though a particular GM engine may operate differently in a factory or in the field.

Creating, Labeling, and Indexing Snapshots of Operational Behavior

Snapshots comprise a stored association between patterns of operational behavior and sets of operating states for machines, and the snapshots may be simplified to facilitate efficient comparison and use. The patterns may be detected by clustering similar operational behavior of machines. The history of operational behavior of machines in the system may be collectively described by multiple clusters of similar behavior, and these clusters may be discovered using any clustering technique. For example, a k-means clustering technique may be used to partition the past machine operating data, including a plurality of measurements at a plurality of instances in time, into k clusters in which each observation or instance of the data belongs to the cluster with the nearest mean.

Each cluster may be defined based on the mean pattern for that cluster. If there are several outliers that are not well-matched to the mean of any cluster, a new cluster may be formed that better models these outliers. One or multiple outlying patterns may fit into the new cluster, reducing the number of outliers that are not well-matched to the mean of any cluster.

A set of measurements or pattern of data may fit within different clusters to different probabilities or likelihoods. The measurement may be assigned to the closest cluster having the highest probability, but a model may retain information about not just the cluster to which the measurement is assigned but also the likelihood that the measurement fits within the selected cluster. For example, a particular data pattern may be associated with a first cluster representing a first set of operating states with a first expected likelihood value of the operating state and a second, different cluster representing a second, different set of operating states with a second expected likelihood value of the associated operating states. These likelihood values may vary across clusters.

The data patterns are clustered to classify and detect (or infer) operating states or health of machines. The clusters are obtained by breaking up a timeline of past activity into different regions of similar observations. These different regions may be labeled with corresponding operating states based at least in part on generic machine operating definitions or expert label inputs. The model may store, for each cluster of data patterns that appear in the past machine operating data, an association between the cluster of data patterns and a set of operating states. In a first example, the operating states are determined by classifying the data patterns into known, previously generated models of operating states. Such models of operating states are maintained in generic machine operating definitions for different types of machines, and the generic machine operating definitions are stored for diagnosing and managing machines in one or multiple systems.

Gathering Input from Experts

Additionally or alternatively, the operating states represented by the cluster of data patterns may be determined by presenting the data patterns to experts and receiving label inputs from the experts, in a crowd-sourced collaborative filtering manner, that label the data patterns with corresponding operating states (e.g. normal or abnormal state) and provide additional information on severity of such states. These previously received label inputs may then be used to semantically label incoming unknown data with corresponding identifiers of operating states. If the label inputs are in conflict or disagreement with each other, the label inputs may be weighed and used to probabilistically determine which label corresponds to which data pattern, with some labels having a higher likelihood than others corresponding to a given data pattern.

In one embodiment, the modeling logic determines a likelihood value for an association between a pattern of data and a set of operating states based at least in part on at least two conflicting sets of previously received label inputs that labeled the particular data pattern as the particular set of one or more operating states. For example, the modeling logic may prompt different experts for opinions regarding particular patterns, and the experts may provide their opinions in response to the prompts by labeling different patterns with different operational states.

Different experts may disagree as to which operating states are reflected by a given pattern of data and even regarding which parameters are relevant to particular operating states. For example, one expert may characterize pattern A as representing operating states X and pattern B as representing operating states Y. Another expert may characterize pattern A as representing operating states X and Y and pattern B as representing operating states Z. Because the experts are in partial disagreement regarding pattern A, the association between A and X may be higher than the association between A and Y. Because the experts are in complete disagreement regarding pattern B, both the association between B and Y and the association between B and Z may be low.

In the example, the experts are characterizing the same patterns over a same time series. However, a first expert may identify a first subset of parameters over the time series that the first expert believes are relevant to a particular operating state, and a second expert may identify a second subset of parameters over the same time series that the second expert believes are relevant to the same particular operating state. In other words, the experts might disagree on what information is relevant in addition to potentially disagreeing on what operating state the relevant information likely represents.

The modeling logic may incorporate label inputs from other experts to cause these association values to be raised if these other experts are in complete or partial agreement with the experts who already provided opinions, or lowered if these other experts are in complete or partial disagreement with the experts who already provided opinions.

Focusing on Relevant or Highly Correlated Parameters

Different data patterns may be defined based on different subsets of relevant parameters. For example, the power input to a particular machine may not be relevant for detecting a particular long-term degradation state, such as growth of crack in the structure, that involves the particular machine. However, the power input to the particular machine may be relevant to detecting whether the machine efficiency is degrading due to degradation in transmission fluid. Similarly, a consistent increase in the frequency in which the particular machine trips may be relevant to detecting the long-term degradation state of its components, but the frequency of trips may not be relevant to detecting whether the machine is degrading due to crack growth. A single snapshot associating multiple observed parameters may later be used to estimate that a machine matching the snapshot is in a given state that is associated with the snapshot.

Indexing Patterns as Snapshots

Multiple patterns may be indexed according to key characteristics in order to quickly discover which snapshots match current data. For each pattern, the key characteristics for the pattern may be stored as a snapshot that represents the pattern. For example, information that describes the frequencies, magnitudes, shapes, offsets, or variables of the data patterns may be stored as snapshots in association with the patterns themselves, and a mapping may be created and stored to map different combinations of these characteristics to different snapshots. In order to find a relevant snapshot, instead of performing a comparison between the current data and all other clusters of data, a diagnostic server may quickly compare characteristics of the current data to indexed characteristics of the snapshots that represent the clusters of data. For example, a data pattern may represent millions of past measurements, but the pattern itself may be easily summarized in a snapshot as a bell curve having a frequency of X, a magnitude of Y, and a center or offset of Z. If current data is similar to a bell curve having a frequency near X, a magnitude near Y, and an offset near Z, then the current data may be matched to the snapshot.

In one embodiment, different snapshots may have different temporal features or time length values such as different frequencies or different durations. A first of the snapshots may correspond to a first set of machine operating states, and a second of the snapshots may correspond to a second set of machine operating states. The machine operating models, which include the snapshots, allow the expected operational behavior to describe particular machines as concurrently in both the first set of operating states and the second set of operating states. A machine's current operating behavior could, with a high degree of likelihood, match both a first snapshot associated with a long-term state and another snapshot associated with a short-term state. For example, a particular machine may be in the operating state labeled as long-term running and degrading at the same time that the particular machine is in the operating state labeled as a trip, which is likely more of a short-term state. The machine operating model may predict, with varying probabilities, that a machine is likely to be in multiple short-term states, in multiple-long term states, or otherwise in multiple states. For example, a machine's current operating behavior could, with a high degree of likelihood, match multiple non-conflicting states simultaneously, or, with a low degree of likelihood, match at least one state that conflicts with another state that matches the current operating behavior. Conflicting states are states that cannot be or are very unlikely to be simultaneously true in practice. For example, a machine generally cannot be starting and shutting down at the same time. The model may be used to predict, based on matching current data with snapshots, that a machine is 75% likely to be starting up, 20% likely to be shutting down, and 5% likely to be in some other state.

The generic definition may include (generated) models that predict states at one or various levels of the system hierarchy. For example, the models may predict individual sensor-level states and their corresponding expected values based on individual measurements collected from individual sensors. In a particular example, a heat sensor model instantiated for multiple temperature sensors in an area, may provide an indication whether one of the sensors is drifting at a certain location. Models in the generic definition may also predict component-level states and their corresponding expected values, where multiple sensors may contribute to each component-level state. In a particular example, a single component may have heat sensors, power sensors, and movement sensors that measure various aspects of operation of the machine. The models may also predict unit-level states and their corresponding expected values, where multiple components may contribute to each unit-level state. In a particular example, a single unit may include multiple components that are operating in varying states and for various purposes. Further, in the example hierarchy, higher level models may also predict system-level values, where multiple units contribute to each system-level value. In a particular example, a single system may include multiple units that are operating in varying states and for various purposes. These units may be dependent or independent of each other.

Figure 2:
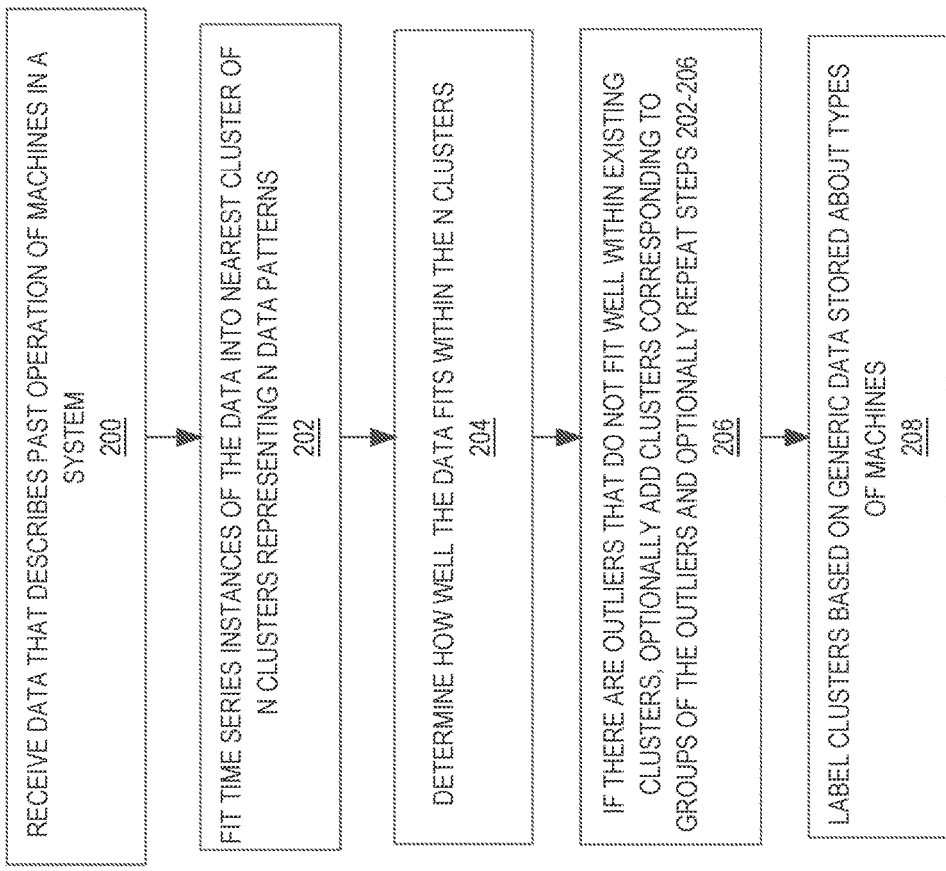
FIG. 2 illustrates an example flow at a site where models get constructed to predict operational behavior of machines.

FIG. 2 illustrates an example process for generating models by labeling clusters of data. As shown, in step 200, the process includes receiving data that describes past operation of machines in a system. In step 202, modeling logic operating on one or more computing devices fits time series instances of the data into nearest clusters of N clusters representing N data patterns. Then, the modeling logic determines how well the data fits within the N clusters in step 204. If there are any outliers that do not fill well within existing clusters, then, in step 206, the modeling logic optionally adds clusters corresponding to groups of the outliers and optionally repeats steps 202-206.

Once at least some clusters have been determined to be satisfactory and providing adequate coverage of the data, the modeling logic may, in step 208, label clusters based on generic data stored about types of machines. For example, the modeling logic may determine that a particular cluster describes measurements about a particular type of machine, and that a particular generic definition describes expected characteristics or patterns for a particular operating state of that type of machine. The modeling logic may then determine that the observed measurements for a cluster are similar to the expected characteristics or patterns for the particular operating state, and the modeling logic may label the cluster as describing past operation of the particular type of machine when the particular type of machine was in the particular operating state. Alternatively or additionally, the modeling logic may receive, via a label input interface, expert input that labels the clusters of operating data.

Figure 10:
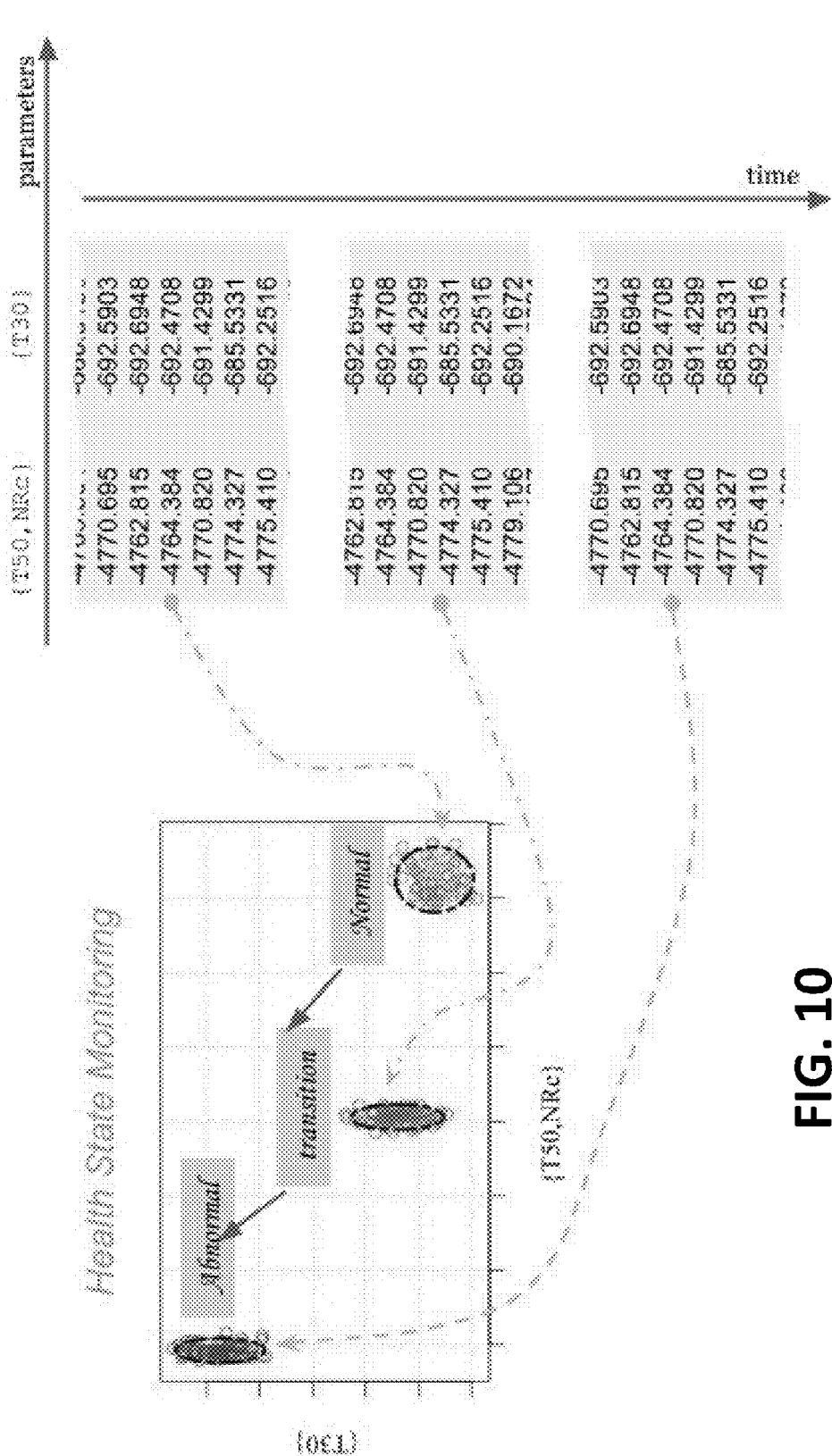
FIG. 10 illustrates example clusters of data and corresponding states that are detected in data collected from machines.

FIG. 10 illustrates a mapping of a series of data (here Temperature T50 and T30 and Pressure Ratio NRc) for the Turbofan example (in FIG. 8) to multiple operating state models for normal and abnormal behavior patterns. Such cluster models, represented symbolically in the form of health_state attributes and/or quantitatively in the form of i) confidence levels associated with the model and/or ii) centroids (or means) of the model may also be part of the stored model.

Machine Operating States

The machine operating states of the plurality of machines may include states characterized by their normality or abnormality, such as any of nominal states, abnormal states, and/or intermediate degradation or failing states before end failure states. The nominal states are characterized by operational behavior that is most common or normal for machines of a given type. The abnormal states are characterized by operational behavior that is less common for machines of a given type, but which is not usually, in the short-term, followed by failure. The failure states are characterized by operational behavior that is relatively likely, as compared to other operating states, to be followed by failure. A single machine may have multiple components that are in same or different operating states, and the machine itself may be in a single or multiple operating states. Some components may not affect the operating states of the machine to which they are a part, and other components may have varying affects on the operating states of the machine and/or other components.

The operating states may also account for different phases of operation for the machine or component. The operating states may include any of starting, running, shutting down, tripping, degrading in the short-term or long-term, failing, operating for a prolonged amount of time, or shutting down for a prolonged amount of time.

The operating states may further be characterized by a combination of a phase of operation and a level of normality or abnormality. For example, a device may be in nominal running state, an abnormal starting state, or a normal long-term degradation state.

Snapshots Based on Physical Dependencies, Virtual Sensors, and Unknown Variables The modeling logic may also account for other information in addition to the generic definitions and the operating data. In one example, the modeling logic accounts for physical dependencies between different machines. These physical dependencies may be discovered from a stored metamodel that describes relationships between the different machines. The metamodel may be created and/or modified for a system based on the positions and uses of the machines in a system. The modification may be automatic when the machine detects that a machine has been added or changed position or use, automanual when a user selects, on an interface, to add or change a position or use of a machine, or manual when an administrator modifies the metamodel to account for an added or changed position or use of a machine.

Example relationships in the metamodel indicate which machines are upstream or downstream of other devices, which outputs from one machine are used as inputs to another machine, and/or whether the machines complement each other or are in competition for each other for certain resources, which may come from the environment or other systems, or may come from other machines within the system.

The modeling logic may create virtual sensors to detect certain patterns in operating data from physical sensors and possibly also from other virtual sensors. Other patterns in the machine operating states may be recognized based on the readings or states estimated by other virtual sensors. In one example, the modeling logic may create a hierarchy of virtual sensors. The hierarchy may include at least a first virtual sensor configured to detect patterns in data collected from physical sensors, and the second virtual sensor may be configured to detect patterns based at least in part on the first virtual sensor and the data collected from physical sensors or data collected from other virtual sensors. In the example, the second virtual sensor is said to depend from the first virtual sensor because it accounts for readings from the first virtual sensor. The physical and virtual sensors may be monitored together for building and/or using the machine operating model.

The modeling logic may also estimate unknown or hidden variables associated with a machine, and stored data patterns may depend on these unknown variables. For example, the machine operating model may form an estimate of hidden machine degradation (e.g. from wearing of bearings that cannot be directly observed) based on a variety of factors such as past performance of a machine. In a particular example, the virtual sensor model capturing the machine operating degradation is estimated using an expectation maximization technique based on operating data. The estimate may be integrated into the machine operating models by making certain patterns depend on the value of the estimate. For example, a certain state may be likely only when a machine has likely degraded to a certain estimated degradation value.

Using the Snapshots to Estimate Operating States or Predict Operational Behavior The computational device generating and managing the modeling logic may send machine operating models for a system to the computational device performing the diagnostic logic for the system. The diagnostic logic may be system-generic or system-specific. If the diagnostic logic is system-specific, different diagnostic server instances may be in charge of diagnosing and predicting states of machines in different systems. In this example, the modeling logic may send models for a particular system to a particular diagnostic server instance and models for other systems to other diagnostic server instances. These different systems may have same or similar sets of machines but may still have different models due to the different environments and histories of the machines at the different physical sites.

The diagnostic logic may use the models to detect that current operational behavior of particular machines in the system matches a particular data pattern in the models. The particular data pattern may be associated with a particular set of operating states of the particular machines. Based at least in part on detecting that the current operational behavior matches the particular pattern, the diagnostic logic may cause display of an indication that the particular machines are in the particular set of operating states. For example, the diagnostic logic may cause display, on a diagnostic interface, of a warning that a particular gear on a particular machine has degraded and is affecting performance of the particular machine. The diagnostic logic may also cause display of probabilistic data that indicates a degree of certainty in the displayed indication or even different degrees in different indications. Additionally, the diagnostic logic may cause display of other historical time series of data that embody the estimated state. The maintenance engineer may review the displayed information and make a well-informed determination regarding the health or maintenance of the system.

The diagnostic logic may also use the models to estimate a future set of operating states of particular machines. Upon finding a matching pattern and associated operating states, the diagnostic logic may cause display of an indication that the associated operating states may lead to the future set of operating states of the particular machines. The indication may be displayed along with probabilistic data that indicates a degree of certainty in the displayed indication or even different degrees in different indications. Additionally, the diagnostic logic may cause display of other historical time series of data that embody an estimated current state that leads to an estimated future state. The maintenance engineer may review the displayed information and make a well-informed determination on quality maintenance activity (to test, to repair, to replace) regarding the health or maintenance of the system.

The diagnostic logic may also keep track of actions that maintenance engineers took in response to different warnings. Such information may be used by the modeling logic to improve the models and/or by managers of the maintenance engineers to improve or evaluate performance of the maintenance engineers.

Figure 3:
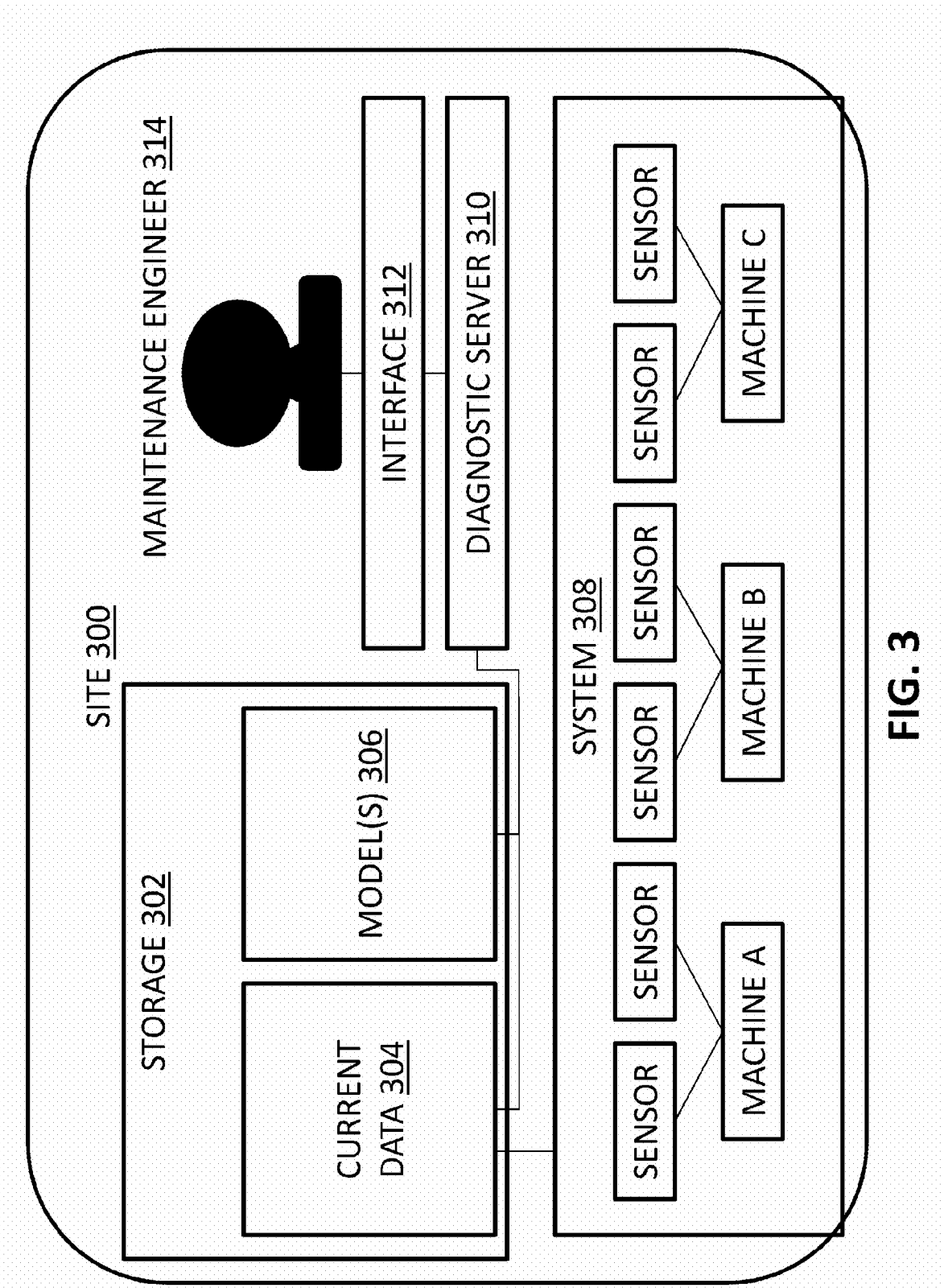
FIG. 3 illustrates an example process for labeling current operating data based on snapshots.

FIG. 3 illustrates an example site where models are used to predict operational behavior of machines. As shown, models 306 and current (incoming sensor) data 304 are stored in storage 302 at site 300. The models represent patterns that are based on past measurements by system 308, and the models may have been generated by modeling logic at site 300 or offsite, for example, via a cloud computing service. Diagnostic server 310 compares current data 304 to models 306 in order to determine whether current data 304 matches any patterns in models 306. Upon detecting that current data 304 does match a pattern in models 306, diagnostic server may present, to maintenance engineer 314 on interface 312 (such as a graphical user interface presented on a display), optionally concurrently:

information that indicates that the current operational behavior matches a pattern in historical operational behavior, information that indicates a likelihood of the match between the current operational behavior and the historical operational behavior, information that indicates operational states associated with the current and/or historical operational behavior, information that indicates a likelihood of the association between the operational states and the current and/or historical operational behavior, information that indicates an overall likelihood for a current state that accounts for both the likelihood of the match and the likelihood of the association, information that indicates an expected future state based on historical operational behavior that is likely to occur after the matched state, information that indicates a likelihood of the future state based on the likelihood that the future state occurred for the matched state in the past, information that indicates steps that should be taken based on steps that were or could have been taken to achieve desirable (such as nominal, non-failure, low cost, and/or high output) states in the past to transition from the matched state, information that indicates a likelihood associated with each set of steps and each set of expected states that could result from the set of steps, and/or information that identifies one or more time series of past data that led to or from the current state, and/or steps that were taken in the past.

Upon receiving the information, maintenance engineer 314 may take responsive action by remedying a current state, avoiding a predicted state, disregarding a warning, or correcting the past data to more accurately reflect past states.

Figure 4:
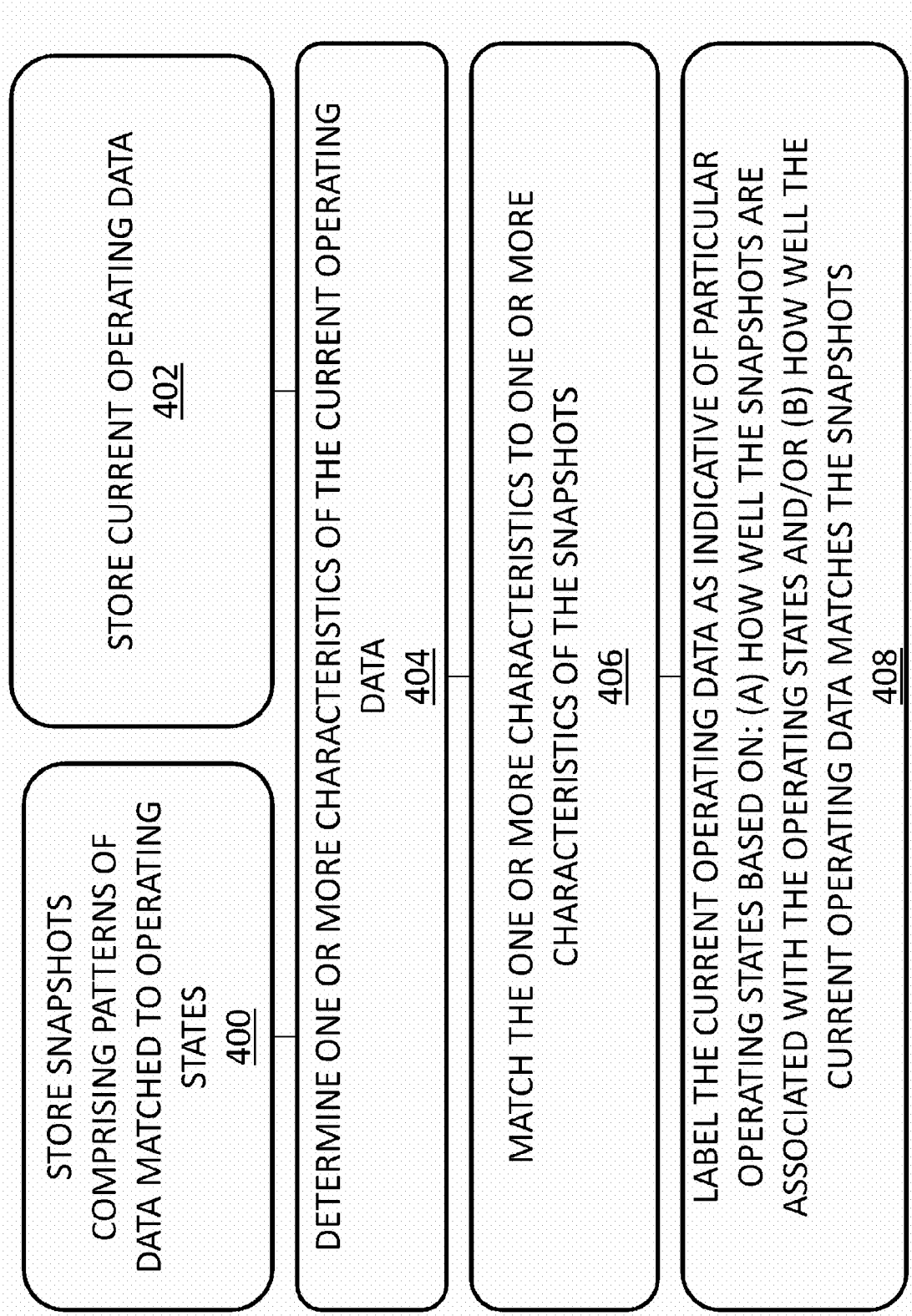
FIG. 4 illustrates an example process for generating models by labeling clusters of data.

FIG. 4 illustrates an example process for labeling current operating data based on snapshots. As shown, the process includes, in step 400 and step 402, storing snapshots and current operating data. The snapshots include patterns of data matches to operating states. Then, in step 404, the process determines one or more characteristics of the current data. For example, the process may determine a frequency or wavelength, magnitude, maximum, minimum, number of peaks, number of troughs, or other pattern-defining information that summarizes the current operating data. In step 406, the process matches the one or more characteristics to one or more characteristics of the snapshots. The snapshots may be stored in association with or indexed according to the characteristics such that the characteristics do not need to be newly determined for the past data. The process then labels the current operating data with particular operating states based on (a) how well the snapshots are associated with the operating states, and/or (b) how well the current operating data matches the snapshots.

The snapshots may be associated with the operating states based on label input and/or generic definitions, and these associations may carry a likelihood that is based on the fit between the label inputs or generic definitions and the patterns. The current operating data may be matched to the snapshot based on how well the characteristics of the current operating data align with the characteristics of the snapshot. The current operating data may match multiple snapshots with different probabilities, and, in fact, the current operating data may be accurately characterized as likely to fit within multiple snapshots concurrently, such as snapshots that cover different lengths of time and describe non-conflicting states.

Reacting to Estimated Operating States or Predicted Operational Behavior

In one embodiment, upon determining an estimated current state or an estimated future state, the diagnostic logic may cause display of specifications of preventive action that is estimated to avoid reaching a possible future operating state that is damaging to the asset and/or incur costly maintenance or remedial action that is estimated to change a current operating state. The preventive action may be learned from logged preventive actions that were previously taken under similar circumstances. The preventive action may also be learned from generic definitions that suggest preventive action periodically for certain types of machines or that suggest preventive action when certain types of machines are behaving in a certain way.

Cloud Service Implementation

In one embodiment, the modeling logic and/or diagnostic logic are implemented in a cloud services platform that is shared and serves multiple systems belonging to the same or different companies. The operating data and generic definitions may be stored on a cloud storage service that stores data for the multiple systems—virtually partitioned to assure security concerns. The generic definitions may be used to build models for multiple systems of the same or different companies, but operating data is available only on a company-specific or system-specific basis. The modeling logic may operate on a cloud computing service that brings up server instances to generate, analyze, and/or modify machine operating models for the plurality of systems. By operating on a cloud services platform, the hardware to support the storage services and computing services may be provisioned on an as-needed basis, and may be scaled up to support intensive machine learning computations that involve, for example, thousands or millions of data parameters and billions or trillions of measurements.

FIG. 5 illustrates an example model manager operating on cloud-based services to generate models that describe expected operational behavior of machines. In the example, cloud storage service 500 stores a dictionary 504 of definitions that are generic with respect to different types of machines. As shown, a first generic definition stores information about a pattern of expected behavior for starting generators of type A, and a second generic definition stores information about a pattern of expected behavior for tripping motors of type B. Cloud storage service 500 also stores data 502A that is received from site 520A and data 502B that is received from site 520B. Data 502A and 502B include past measurements taken by sensors at systems 522A and 522B, respectively.

Cloud computing service 510 is running model manager 506 to access dictionary 504 and data 502A and 502B to create models 508A and 508B that are specific to the respective systems 522A and 522B at the respective sites 520A and 520B. The models 508A and 508B store information specific to machines at the corresponding sites 520A and 520B. As shown, model 508A stores information about typical past operational behavior of a GE generator at site 520A as the generator is starting up and information about typical past operating behavior of a GE motor at site 520A as the motor is tripping. Also as shown, model 508B stores information about typical past operating behavior of an HW generator at site 520B as the generator is starting up and information about typical past operating behavior of an HW motor at site 520B as the motor is tripping. In the example, the models show a measurement parameter over time, such as a measurement of the machine's output over different types. Although the measurement data is graphed for illustration purposes, the measurement data can also be represented by a function or characteristics that describe what the shape would look like if graphed. For example, the model may include the frequency, maximum, minimum, and/or number of peaks and troughs in the graph.

Also, the examples show a single output parameter illustrated as a graphical pattern, but the snapshots may be based on multiple parameters or measurements collected from multiple sensors. For example, a single snapshot may describe a composite pattern that includes multiple sub-patterns, such as one for heat measurements over time and another for engine speeds over time. The different sub-patterns may be based on the same length of time or different lengths of time, and the measurements may partially overlap, fully overlap, or not overlap at all. For example, a composite pattern may include an engine speed sub-pattern that is followed by a heat sub-pattern, whether or not the sub-patterns overlap in time.

In the example, the generators may be of the same type even though they are from different manufacturers. The generic definition for a generator of type A shows a curve that is very similar to the curves for the different types of generators, and the model manager may label the operating state of snapshots A in models 508A and 508B as "starting" based on the similarity with the generic definition. Similarly, the HW motor in snapshot B of model 508B may be of type B and may be labeled as "tripping" in light of its similarity with the stored definition for machines of type B. Snapshot B in model 508A does not fit a stored definition, but it may be labeled based on label input received from experts, labeled with an unknown label, or labeled with a predicted label based on generic tripping definitions for other types of machines even though there is no generic definition for the GE motor.

Diagnostic server 524A uses models 508A to diagnose and predict states for system 522A based on current measurements from sensors in system 522A. Similarly, diagnostic server 524B uses models 508B to diagnose and predict states for system 522B on current measurements from sensors in system 522B. For example, diagnostic server 524B may detect that an HW motor is in the middle of a trip and has restarted twice because the current data is similar to the first two troughs of the pattern in snapshot B of model 508B. Accordingly, diagnostic server 524B may predict that the HW motor will restart a third time before starting up to full power. This prediction may be displayed to a maintenance engineer and used to mitigate costs associated with the additional restart of the HW motor.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 6:
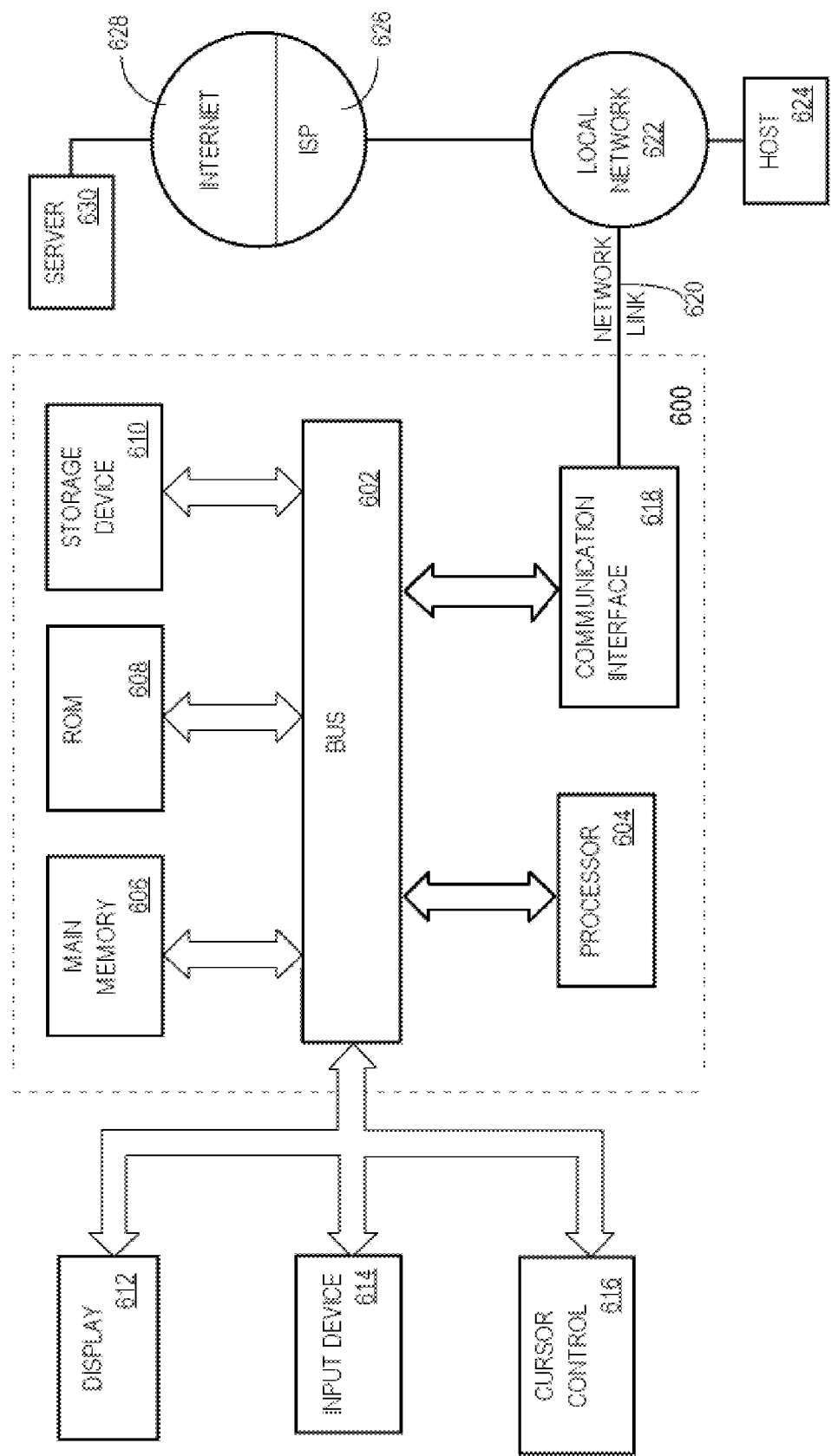
FIG. 6 illustrates an example computer system that may be configured to implement various computer-implemented processes described herein.
Figure 7A:
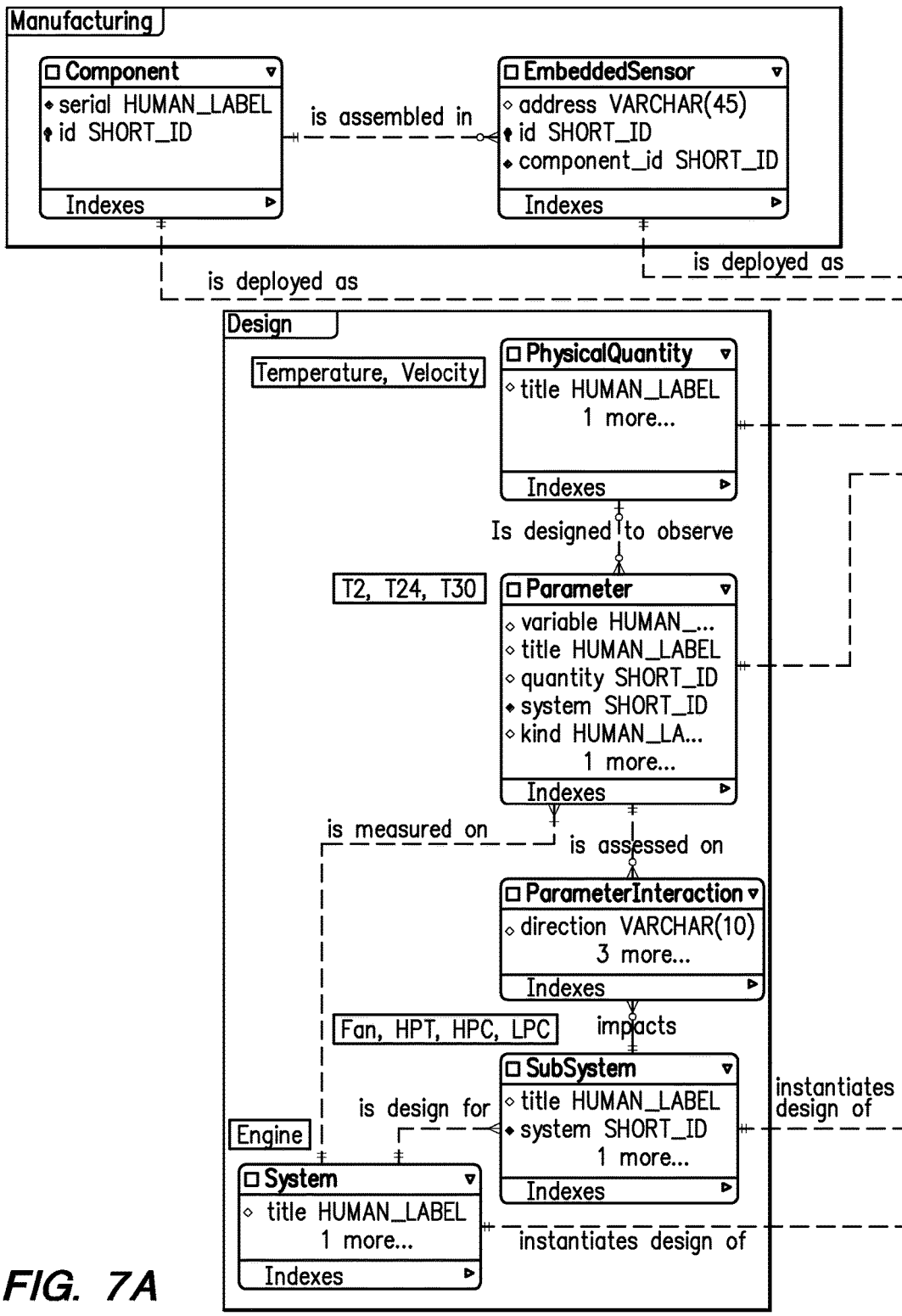
FIG. 7A, FIG. 7B, FIG. 7C, FIG. 7D illustrate an example generic definition of a system. The generic definition incorporates generic sub-definitions for multiple entities in the system at varying degrees of specificity.
Figure 7B:
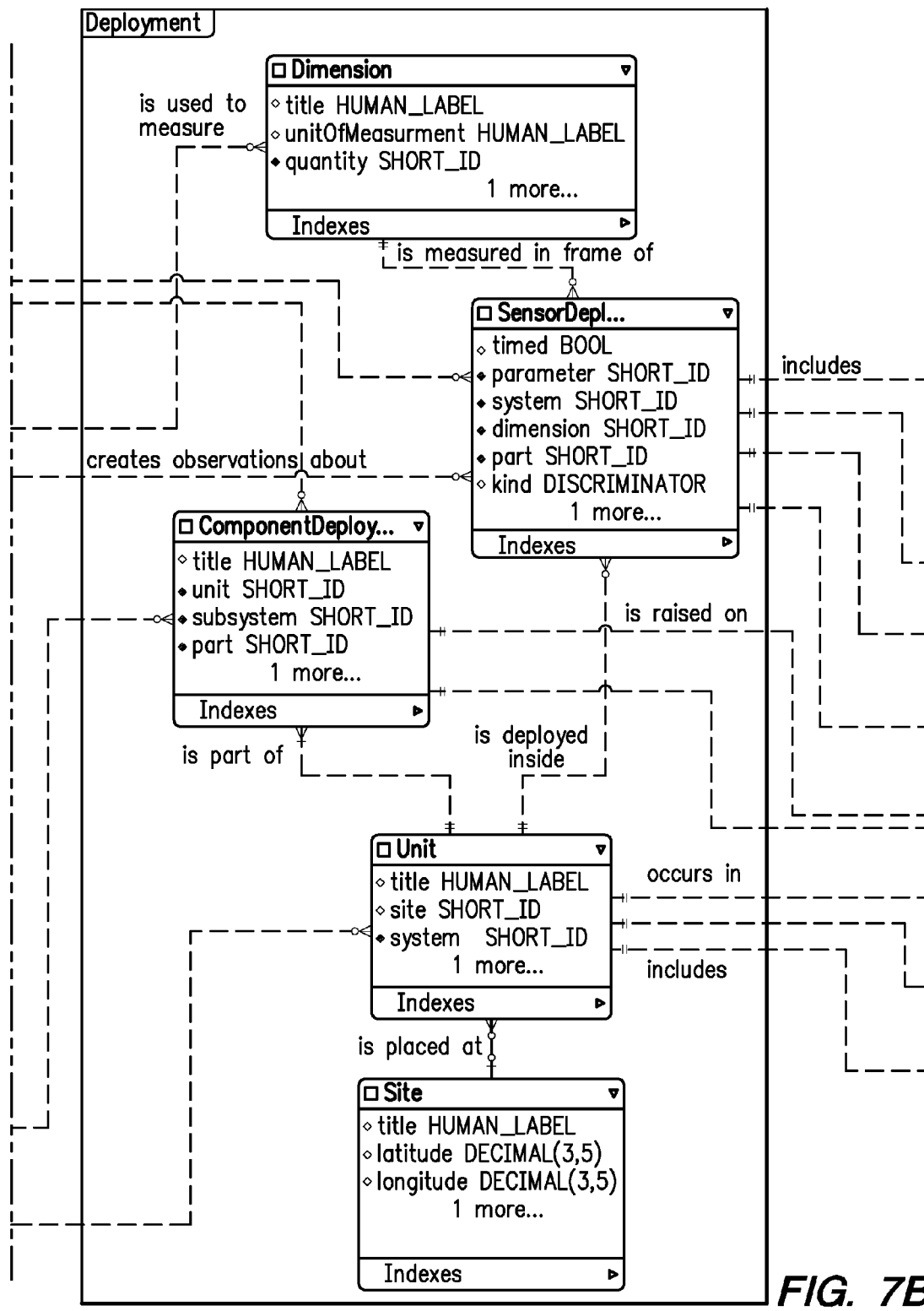
Figure 7C:
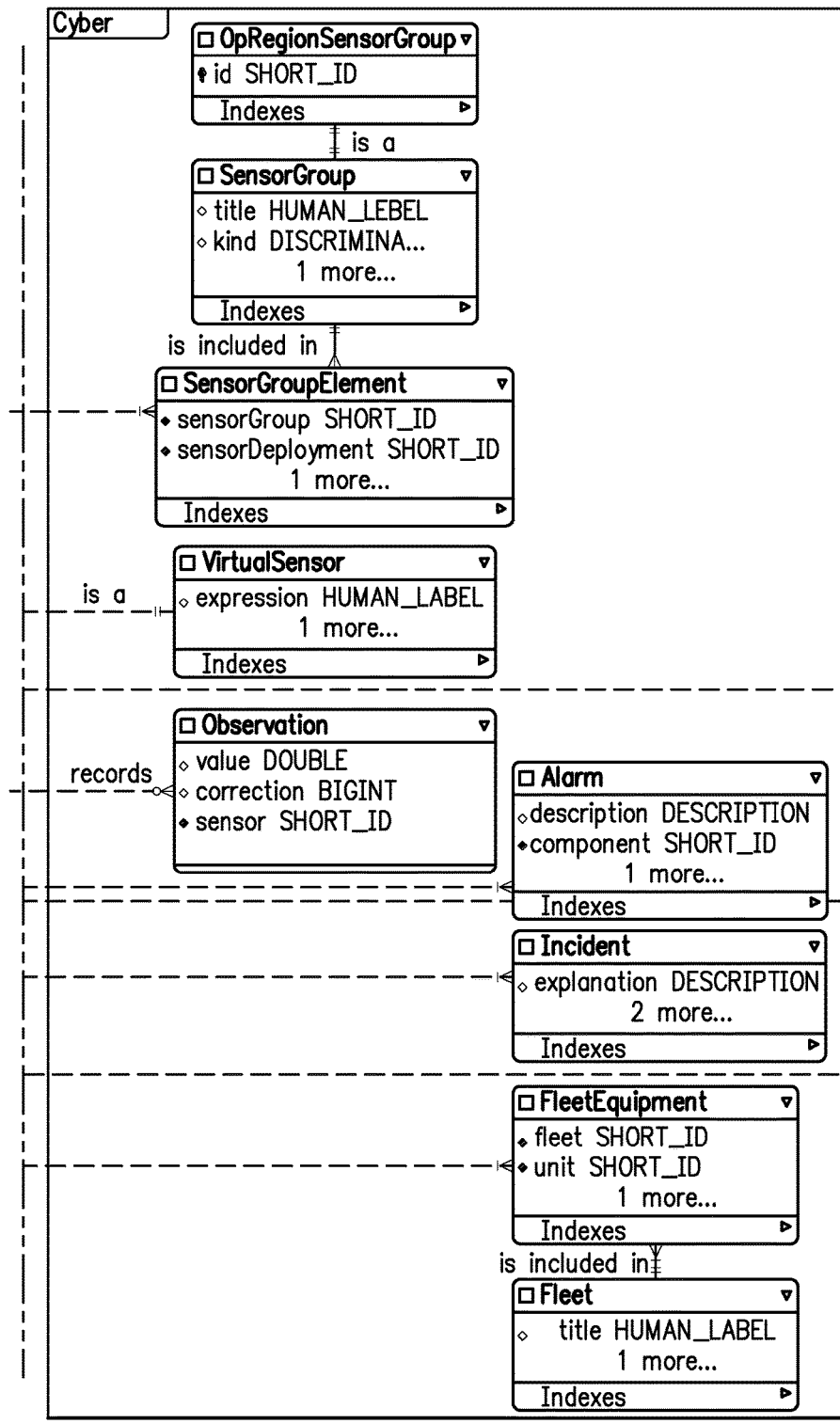
Figure 7D:
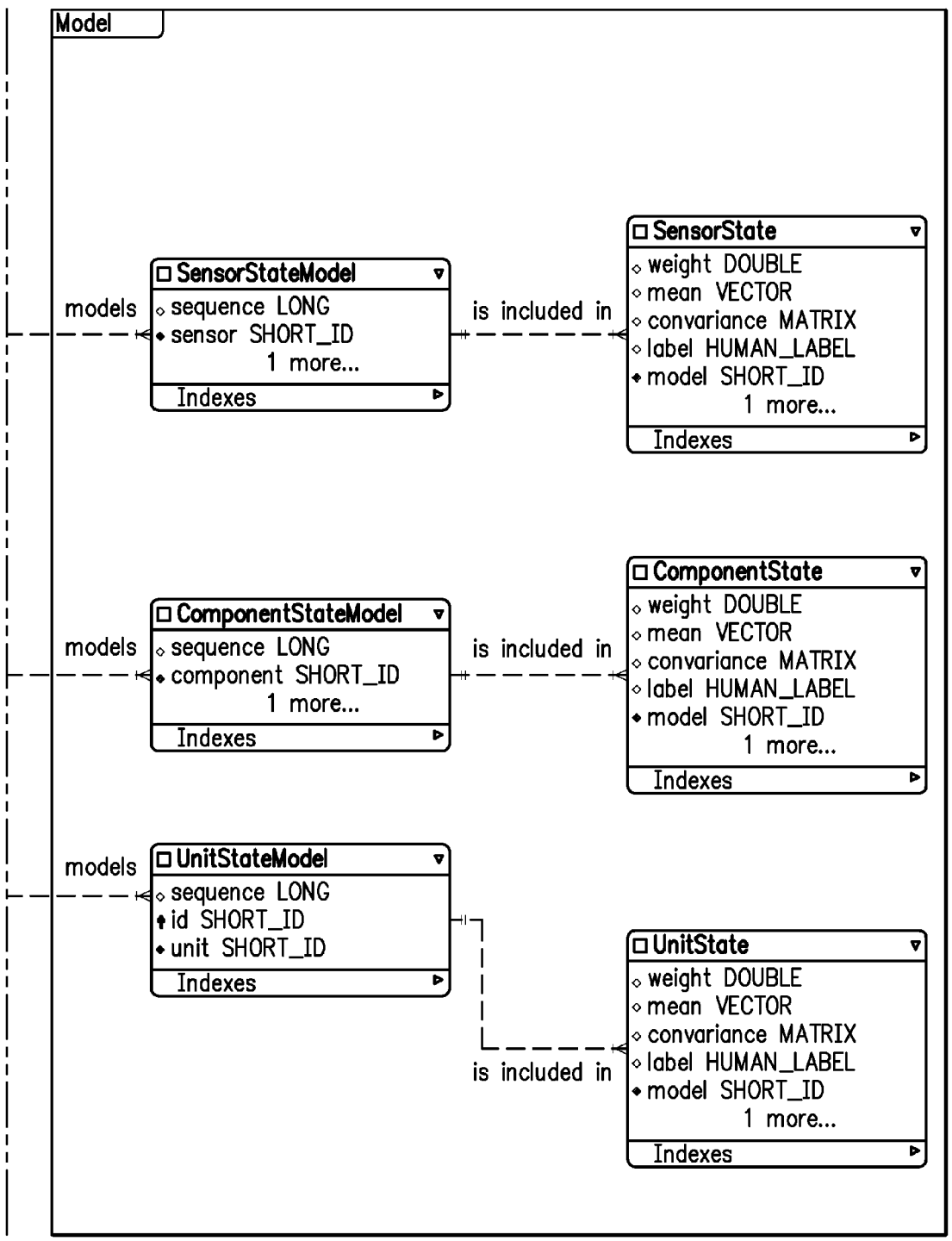

For example, FIG. 6 is a block diagram that illustrates a computer system 600 upon which an embodiment of the invention may be implemented. Computer system 600 includes a bus 602 or other communication mechanism for communicating information, and a hardware processor 604 coupled with bus 602 for processing information. Hardware processor 604 may be, for example, a general purpose microprocessor.

Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Such instructions, when stored in non-transitory storage media accessible to processor 604, render computer system 600 into a special-purpose machine that is customized to perform the operations specified in the instructions.

Computer system 600 further includes a read only memory (ROM) 608 or other static storage device coupled to bus 602 for storing static information and instructions for processor 604. A storage device 610, such as a magnetic disk, optical disk, or solid-state drive is provided and coupled to bus 602 for storing information and instructions.

Computer system 600 may be coupled via bus 602 to a display 612, such as a LED display monitor, for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 604 executing one or more sequences of one or more instructions contained in main memory 606. Such instructions may be read into main memory 606 from another storage medium, such as storage device 610. Execution of the sequences of instructions contained in main memory 606 causes processor 604 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 610. Volatile media includes dynamic memory, such as main memory 606. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 602. Transmission media can also take the form of acoustic or light waves, such as those generated during radio-wave and infra-red data communications.

Various forms of media may be involved in carrying one or more sequences of one or more instructions to processor 604 for execution. For example, the instructions may initially be carried on a magnetic disk or solid-state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 602. Bus 602 carries the data to main memory 606, from which processor 604 retrieves and executes the instructions. The instructions received by main memory 606 may optionally be stored on storage device 610 either before or after execution by processor 604.

Computer system 600 also includes a communication interface 618 coupled to bus 602. Communication interface 618 provides a two-way data communication coupling to a network link 620 that is connected to a local network 622. For example, communication interface 618 may be an integrated services digital network (ISDN) card, cable modem, satellite modem, or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the world wide packet data communication network now commonly referred to as the "Internet" 628. Local network 622 and Internet 628 both use electrical, electromagnetic or optical signals that carry digital data streams. The signals through the various networks and the signals on network link 620 and through communication interface 618, which carry the digital data to and from computer system 600, are example forms of transmission media.

Computer system 600 can send messages and receive data, including program code, through the network(s), network link 620 and communication interface 618. In the Internet example, a server 630 might transmit a requested code for an application program through Internet 628, ISP 626, local network 622 and communication interface 618.

The received code may be executed by processor 604 as it is received, and/or stored in storage device 610, or other non-volatile storage for later execution.

As described herein, the terms "first," "second," "particular," and "certain" may be used to single out an entity or distinguish different entities in a set of entities. Unless otherwise indicated herein, these terms do not require any ordering of the entities. Also as described herein, example steps may be described in example orders. Unless otherwise indicated herein or unless one step functionally depends on another step, steps may be performed in any order that is functional for a given implementation.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method comprising:

storing one or more machine operating definitions of types of machines for multiple different individual machines, wherein each of the machine operating definitions describes expected operational behavior of one or more types of machines during one or more operating states rather than operational behavior of individual machines;

the operating states comprising starting, running and shutting down states;

receiving operational data from one or more sensors of a plurality of machines, the sensors configured to measure at least one of temperature, pressure, speed, vibration, current, sound, power or resource consumption, movement, torque, power output, or byproduct output;

analyzing the received operational data that describes past operation of the plurality of machines of a plurality of types and which individual machines of the plurality of machines were in operation in a certain location in a certain manner and during a certain time;

based at least in part on the analyzing the received operational data and the one or more machine operating definitions, generating and storing one or more machine operating models that describe expected operational behavior corresponding to a plurality of operating states of the plurality of machines;

wherein the one or more machine operating models comprise a plurality of data patterns, wherein each of the data patterns is associated with a different set of one or more operating states of one or more machines;

wherein the method is performed by one or more computing devices;

wherein the one or more machine operating definitions comprise at least a first machine operating definition and a second machine operating definition, wherein the first machine operating definition describes expected operational behavior of one or more first types of machines during one or more first operating states, and wherein the second machine operating definition describes expected operational behavior of one or more second types of machines during one or more second operating states, wherein the one or more first types of machines differ from the one or more second types of machines by model or vendor;

using the one or more models, causing generating and displaying on a computer display device one or more specifications of preventive action for one of the plurality of machines that is estimated to avoid reaching a possible future operating state that is damaging to one of the plurality of machines or remedial action that is estimated to change a current operating state.

2. The method of claim 1, comprising indexing the one or more machine operating models based at least in part on frequencies and magnitudes of physical parameters defining the data patterns.

3. The method of claim 1, wherein the operating data comprises a plurality of machine operating measurements obtained from a plurality of sensors on the plurality of machines.

4. The method of claim 1, comprising detecting that current operational behavior of one or more particular machines of the plurality of machines matches a particular data pattern of the plurality of data patterns, wherein the particular data pattern is associated with a particular set of one or more operating states of the one or more particular machines; causing displaying an indication that the one or more particular machines are in a particular set of one or more operating states.

5. The method of claim 1, comprising detecting that current operational behavior of one or more particular machines of the plurality of machines matches a particular data pattern that is associated with a particular set of one or more operating states of the one or more particular machines; estimating a future set of one or more operating states of one or more of the plurality of machines.

6. The method of claim 1, wherein the machines are in a system of a plurality of systems; comprising receiving and storing the operating data using a cloud storage service that stores data for the plurality of systems; generating the one or more models using a cloud computing service that computes models for the plurality of systems; and using the one or more definitions to generate different models for different systems of the plurality of systems.

7. The method of claim 1, wherein each association between data patterns of the plurality of data patterns and the different sets of one or more operating states comprises an expected likelihood value, and wherein a particular data pattern of the plurality of data patterns is associated with a first set of one or more operating states with a first expected likelihood value, and wherein the particular data pattern is associated with a second set of one or more operating states with a second expected likelihood value, wherein the first set is different than the second set, and wherein the first expected likelihood value is different than the second expected likelihood value.

8. The method of claim 1, wherein a first data pattern of the plurality of data patterns is associated with a first set of one or more operating states of one or more particular machines, and wherein a second data pattern of the plurality of data patterns is associated with a second set of one or more operating states of the one or more particular machines; wherein the first data pattern has a different temporal feature than the second data pattern; and wherein the one or more machine operating models allow the expected operational behavior to describe the one or more particular machines as concurrently in both the first set of one or more operating states and the second set of one or more operating states.

9. The method of claim 1, wherein, for a machine, a first data pattern of the plurality of data patterns is defined based on a first subset of relevant parameters of a plurality of parameters related to the plurality of machines, and wherein a second data pattern of the plurality of data patterns is based on a second subset of relevant parameters of the plurality of parameters.

10. The method of claim 1, wherein generating one or more machine operating models is based at least in part on one or more physical dependencies between different machines of the plurality of machines; comprising determining the one or more physical dependencies from a stored metamodel that describes relationships between different machines of the plurality of machines.

11. The method of claim 1, wherein the plurality of operating states include two or more of: starting, running, shutting down, tripping, failing, a certain level of degradation, operating for a prolonged amount of time at some level of performance, or shutting down for a prolonged amount of time.

12. The method of claim 1, wherein a particular machine operating definition of the one or more machine operating definitions describes an expected output of one or more particular types of machines during a particular operating state.

13. The method of claim 1, comprising establishing a probabilistic association between a particular data pattern of the plurality of data patterns and a particular set of one or more operating states based at least in part on at least two conflicting sets of previously received label inputs that labeled the particular data pattern as the particular set of one or more operating states.

14. The method of claim 1, further comprising altering one or more of the plurality of operating states of the plurality of machines based at least in part on the expected operational behavior corresponding to the plurality of operating states of the plurality of machines.

15. One or more non-transitory computer-readable storage media storing instructions which, when executed, cause:
storing one or more machine operating definitions of types of machines for multiple different individual machines, wherein each of the machine operating definitions describes expected operational behavior of one or more types of machines during one or more operating states rather than operational behavior of individual machines;
the operating states comprising starting, running and shutting down states;
receiving operational data from one or more sensors of a plurality of machines, the sensors configured to measure at least one of temperature, pressure, speed, vibration, current, sound, power or resource consumption, movement, torque, power output, or byproduct output;
analyzing the received operational data that describes past operation of the plurality of machines of a plurality of types which individual machines of the plurality of machines were in operation in a certain location in a certain manner and during a certain time;
based at least in part on the analyzing the received operational data and the one or more machine operating definitions, generating and storing one or more machine operating models that describe expected operational behavior corresponding to a plurality of operating states of the plurality of machines;
wherein the one or more machine operating models comprise a plurality of data patterns, wherein each of the data patterns is associated with a different set of one or more operating states of one or more machines,
wherein generating one or more machine operating models is based at least in part on one or more physical dependencies between different machines of the plurality of machines;
wherein the instructions, when executed, cause determining the one or more physical dependencies from a stored metamodel that describes relationships between different machines of the plurality of machines;

using the one or more models, causing generating and displaying on a computer display device one or more specifications of preventive action for one of the plurality of machines that is estimated to avoid reaching a possible future operating state that is damaging to one of the plurality of machines or remedial action that is estimated to change a current operating state.

16. The one or more non-transitory computer-readable storage media of claim 15, wherein the instructions, when executed, cause indexing the one or more machine operating models based at least in part on frequencies and magnitudes of physical parameters defining the data patterns.

17. The one or more non-transitory computer-readable storage media of claim 15, wherein the instructions, when executed, cause:

continuously receiving new operating data from the plurality of machines;

continuously adding old operating data to an updated collection of past machine operating data; and continuously modifying the one or more machine operating models based on the updated collection of past machine operating data.

18. The one or more non-transitory computer-readable storage claim 15, further comprising altering one or more of the plurality of operating states of the plurality of machines based at least in part on the expected operational behavior corresponding to the plurality of operating states of the plurality of machines.

19. A system, comprising one or more computing devices, and one or more memories, storing instructions that, when executed by the computing devices, cause the computing device to perform a method of:

storing one or more machine operating definitions of types of machines for multiple different individual machines, wherein each of the machine operating definitions describes expected operational behavior of one or more types of machines during one or more operating states rather than operational behavior of individual machines;

the operating states comprising starting, running and shutting down states;

receiving operational data from one or more sensors of a plurality of machines, the sensors configured to measure at least one of temperature, pressure, speed, vibration, current, sound, power or resource consumption, movement, torque, power output, or byproduct output;

analyzing the received operational data that describes past operation of the plurality of machines of a plurality of types and which individual machines of the plurality of machines were in operation in a certain location in a certain manner and during a certain time;

based at least in part on the analyzing the received operational data and the one or more machine operating definitions, generating and storing one or more machine operating models that describe expected operational behavior corresponding to a plurality of operating states of the plurality of machines;

wherein the one or more machine operating models comprise a plurality of data patterns, wherein each of the data patterns is associated with a different set of one or more operating states of one or more machines;

wherein the method is performed by one or more computing devices;

wherein the one or more machine operating definitions comprise at least a first machine operating definition and a second machine operating definition, wherein the first machine operating definition describes expected operational behavior of one or more first types of machines during one or more first operating states, and wherein the second machine operating definition describes expected operational behavior of one or more second types of machines during one or more second operating states, wherein the one or more first types of machines differ from the one or more second types of machines by model or vendor;

using the one or more models, causing generating and displaying on a computer display device one or more specifications of preventive action for one of the plurality of machines that is estimated to avoid reaching a possible future operating state that is damaging to one of the plurality of machines or remedial action that is estimated to change a current operating state.

* * * * *